(12) United States Patent
Goergen et al.

(10) Patent No.: US 12,038,619 B2
(45) Date of Patent: Jul. 16, 2024

(54) OPTICAL MODULE CAGES MOUNTED FOR OPTIMAL DENSITY AND COOLING

(71) Applicant: Cisco Technology, Inc., San Jose, CA (US)

(72) Inventors: Joel Richard Goergen, Soulsbyville, CA (US); Paolo Sironi, Gallarate (IT); Giovanni Giobbio, Rovellasca (IT); M. Baris Dogruoz, Campbell, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 18/187,152

(22) Filed: Mar. 21, 2023

(65) Prior Publication Data
US 2023/0221510 A1    Jul. 13, 2023

Related U.S. Application Data

(63) Continuation of application No. 17/528,415, filed on Nov. 17, 2021, now Pat. No. 11,650,385.

(60) Provisional application No. 63/145,184, filed on Feb. 3, 2021.

(51) Int. Cl.
| | | |
|---|---|---|
| H04B 10/00 | (2013.01) | |
| G02B 6/42 | (2006.01) | |
| H05K 7/20 | (2006.01) | |

(52) U.S. Cl.
CPC ........... *G02B 6/428* (2013.01); *G02B 6/4256* (2013.01); *G02B 6/4261* (2013.01); *G02B 6/4269* (2013.01); *H05K 7/2039* (2013.01)

(58) Field of Classification Search
CPC .... G02B 6/428; G02B 6/4256; G02B 6/4261; G02B 6/4269; G02B 6/4277; G02B 6/4284; H05K 7/2039
See application file for complete search history.

(56) References Cited

U.S. PATENT DOCUMENTS

| | | | |
|---|---|---|---|
| 6,186,670 B1 | 2/2001 | Austin et al. | |
| 6,478,622 B1* | 11/2002 | Hwang | H01R 13/6596 439/607.2 |
| 6,558,191 B2* | 5/2003 | Bright | G02B 6/4246 439/541.5 |
| 6,867,969 B2* | 3/2005 | Hwang | H05K 9/0058 165/185 |
| 6,972,968 B2* | 12/2005 | Hwang | H05K 9/0058 174/383 |

(Continued)

OTHER PUBLICATIONS

Dogruoz, Baris et al., "Optimizing QSFP-DD Systems to Achieve at Least 25 Watt Thermal Port Performance", http://www.qsfp-dd.com/wp-content/uploads/2021/01/2021-QSFP-DD-MSA-Thermal-Whitepaper-Final.pdf, Jan. 1, 2021, 30 pages.

*Primary Examiner* — Agustin Bello

(57) ABSTRACT

A housing for an electronic device includes a panel, where the panel includes a window. A cage includes a plurality of panels and a first end and a second end that opposes the first end. The cage further includes an opening at its first end and an enclosure disposed between the panels of the cage. Connecting structure is disposed at the first end of the cage, where the connecting structure secures the first end of the cage to the panel. The cage is suitably dimensioned to receive and retain a portion of a pluggable module within the enclosure when the pluggable module is inserted within the opening at the first end of the cage.

20 Claims, 21 Drawing Sheets

(56) References Cited

U.S. PATENT DOCUMENTS

| | | | | |
|---|---|---|---|---|
| 7,438,596 B2 * | 10/2008 | Phillips | H01R 13/6582 | 439/927 |
| 7,591,680 B2 * | 9/2009 | Zhang | H01R 13/6582 | 439/607.17 |
| 7,857,662 B2 * | 12/2010 | Gillespie | H01R 13/658 | 439/607.2 |
| 8,277,252 B2 * | 10/2012 | Fogg | H01R 13/6477 | 439/607.25 |
| 8,358,504 B2 * | 1/2013 | McColloch | G02B 6/4269 | 398/135 |
| 8,382,509 B2 * | 2/2013 | David | H01R 13/6471 | 439/342 |
| 8,545,268 B2 * | 10/2013 | Fogg | H01R 13/6477 | 439/607.25 |
| 8,622,770 B2 * | 1/2014 | Teo | G02B 6/4277 | 439/607.2 |
| 8,864,523 B2 * | 10/2014 | Banakis | H01R 12/724 | 439/607.25 |
| 8,890,004 B2 * | 11/2014 | Wickes | H05K 9/0009 | 174/382 |
| 9,389,368 B1 * | 7/2016 | Sharf | H01R 13/6587 | |
| 9,518,785 B2 * | 12/2016 | Szczesny | G02B 6/4269 | |
| 9,547,140 B2 * | 1/2017 | Wu | G02B 6/4269 | |
| 9,547,141 B2 * | 1/2017 | Wu | G02B 6/4277 | |
| 9,583,886 B2 * | 2/2017 | Phillips | H01R 13/516 | |
| 9,608,377 B1 * | 3/2017 | Phillips | H01R 13/7172 | |
| 9,620,907 B1 * | 4/2017 | Henry | H01R 13/6582 | |
| 9,793,648 B2 * | 10/2017 | Regnier | G02B 6/4201 | |
| 9,831,613 B2 * | 11/2017 | Liu | H01R 13/6583 | |
| 9,846,287 B2 * | 12/2017 | Mack | F28F 1/32 | |
| 9,960,553 B2 * | 5/2018 | Regnier | H01R 12/7005 | |
| 10,104,760 B1 * | 10/2018 | Briant | G02B 6/4284 | |
| 10,178,804 B2 * | 1/2019 | Sharf | H01R 12/70 | |
| 10,241,285 B2 * | 3/2019 | Mack | G02B 6/4269 | |
| 10,305,217 B2 * | 5/2019 | Fernandes | G02B 6/4292 | |
| 10,488,608 B2 * | 11/2019 | Wilcox | G02B 6/4269 | |
| 10,547,133 B1 * | 1/2020 | Consoli | G02B 6/4269 | |
| 10,555,437 B2 * | 2/2020 | Little | G02B 6/428 | |
| 10,651,607 B1 * | 5/2020 | Gawlowski | H01R 13/659 | |
| 10,690,868 B1 * | 6/2020 | Goergen | G02B 6/4436 | |
| 10,797,417 B2 * | 10/2020 | Scholeno | G02B 6/42 | |
| 10,925,182 B2 * | 2/2021 | Sharf | H05K 7/20009 | |
| 10,939,594 B2 * | 3/2021 | Long | H05K 9/0009 | |
| 11,011,861 B1 * | 5/2021 | Briant | H01R 12/721 | |
| 11,088,715 B2 * | 8/2021 | Sharf | G02B 6/4284 | |
| 11,171,443 B2 * | 11/2021 | Regnier | H01R 13/533 | |
| 11,357,132 B2 * | 6/2022 | Chopra | H05K 7/20136 | |
| 11,372,178 B2 * | 6/2022 | Zbinden | G02B 6/4268 | |
| 2002/0025720 A1 * | 2/2002 | Bright | G02B 6/4246 | 439/541.5 |
| 2005/0195565 A1 * | 9/2005 | Bright | H05K 7/20418 | 361/688 |
| 2006/0039123 A1 | 2/2006 | Malagrino et al. | | |
| 2007/0160331 A1 * | 7/2007 | Charny | G02B 6/4261 | 385/92 |
| 2007/0223208 A1 | 9/2007 | Tanaka et al. | | |
| 2010/0079971 A1 * | 4/2010 | Gillespie | H01R 13/658 | 361/816 |
| 2012/0058670 A1 * | 3/2012 | Regnier | H01R 12/00 | 439/485 |
| 2013/0033821 A1 | 2/2013 | Szczesny et al. | | |
| 2013/0034992 A1 * | 2/2013 | Phillips | H01R 13/6581 | 439/527 |
| 2015/0013936 A1 * | 1/2015 | Mack | F28F 1/32 | 165/53 |
| 2015/0244108 A1 * | 8/2015 | Phillips | H01R 13/6581 | 439/271 |
| 2016/0149324 A1 * | 5/2016 | Regnier | H01R 43/205 | 29/874 |
| 2016/0211623 A1 * | 7/2016 | Sharf | G02B 6/4269 | |
| 2016/0295744 A1 * | 10/2016 | Regnier | G02B 6/4284 | |
| 2017/0054234 A1 * | 2/2017 | Kachlic | H01R 13/6583 | |
| 2017/0077643 A1 * | 3/2017 | Zbinden | G02B 6/4268 | |
| 2017/0285282 A1 * | 10/2017 | Regnier | G02B 6/3879 | |
| 2018/0006416 A1 * | 1/2018 | Lloyd | H05K 7/1487 | |
| 2018/0120906 A1 * | 5/2018 | Reed | H05K 7/1487 | |
| 2018/0129001 A1 | 5/2018 | Van Gaal | | |
| 2018/0259731 A1 * | 9/2018 | Dupeux | G02B 6/4271 | |
| 2020/0036142 A1 * | 1/2020 | Pogash | H01R 13/741 | |
| 2020/0076455 A1 * | 3/2020 | Sharf | G02B 6/4277 | |
| 2020/0077541 A1 * | 3/2020 | Sharf | G02B 6/4268 | |
| 2020/0150366 A1 * | 5/2020 | Tittenhofer | G02B 6/4278 | |
| 2020/0285006 A1 * | 9/2020 | Matsui | H05K 7/20145 | |
| 2020/0367392 A1 * | 11/2020 | Long | H01R 13/6582 | |
| 2021/0022268 A1 * | 1/2021 | Sharf | F28F 3/025 | |
| 2021/0105915 A1 * | 4/2021 | Wang | H05K 7/20418 | |
| 2021/0126392 A1 * | 4/2021 | Briant | G02B 6/4292 | |
| 2021/0132311 A1 * | 5/2021 | Shearman | G02B 6/4261 | |
| 2021/0226361 A1 * | 7/2021 | Mason | H01R 13/6471 | |
| 2022/0159878 A1 * | 5/2022 | Dillman | H05K 7/20509 | |
| 2022/0244472 A1 * | 8/2022 | Goergen | G02B 6/428 | |
| 2023/0221510 A1 * | 7/2023 | Goergen | G02B 6/4277 | 361/709 |

* cited by examiner

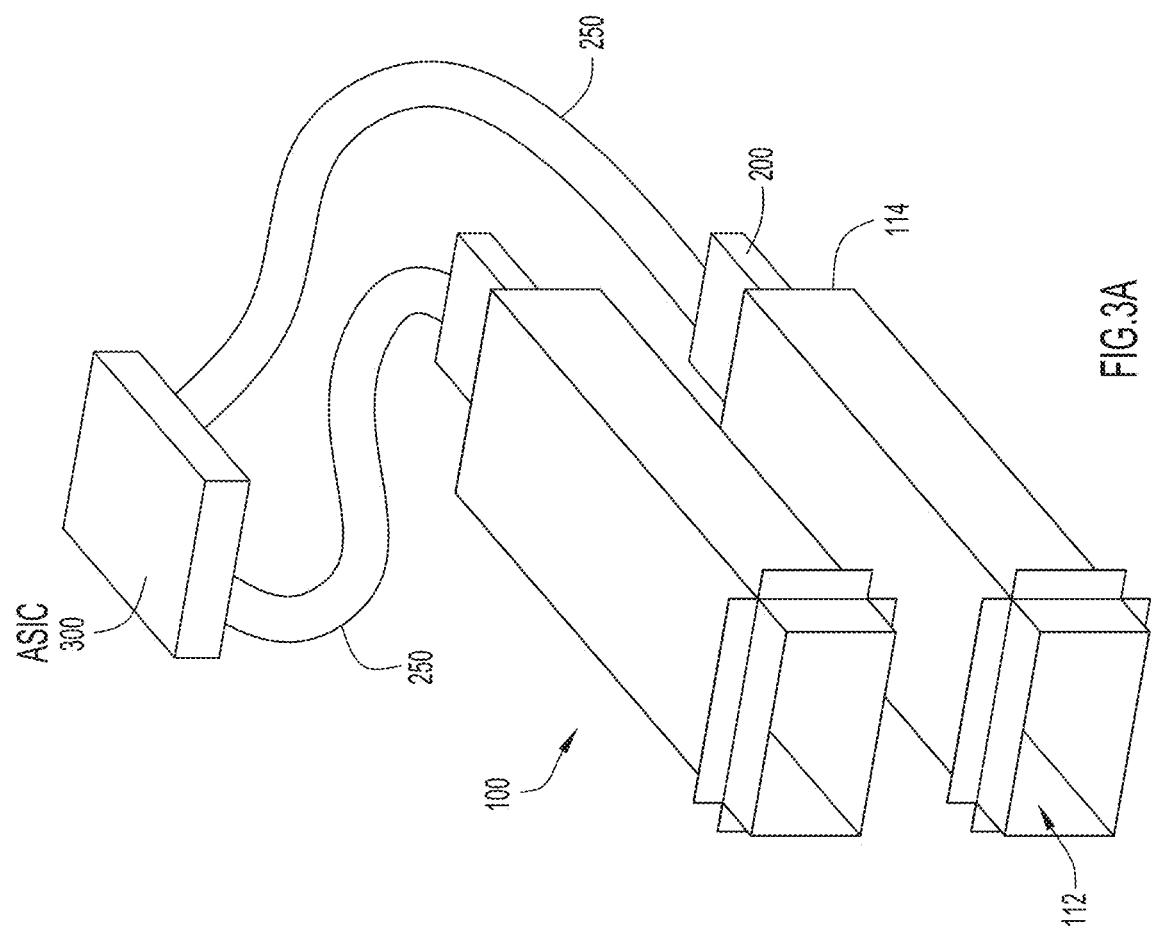

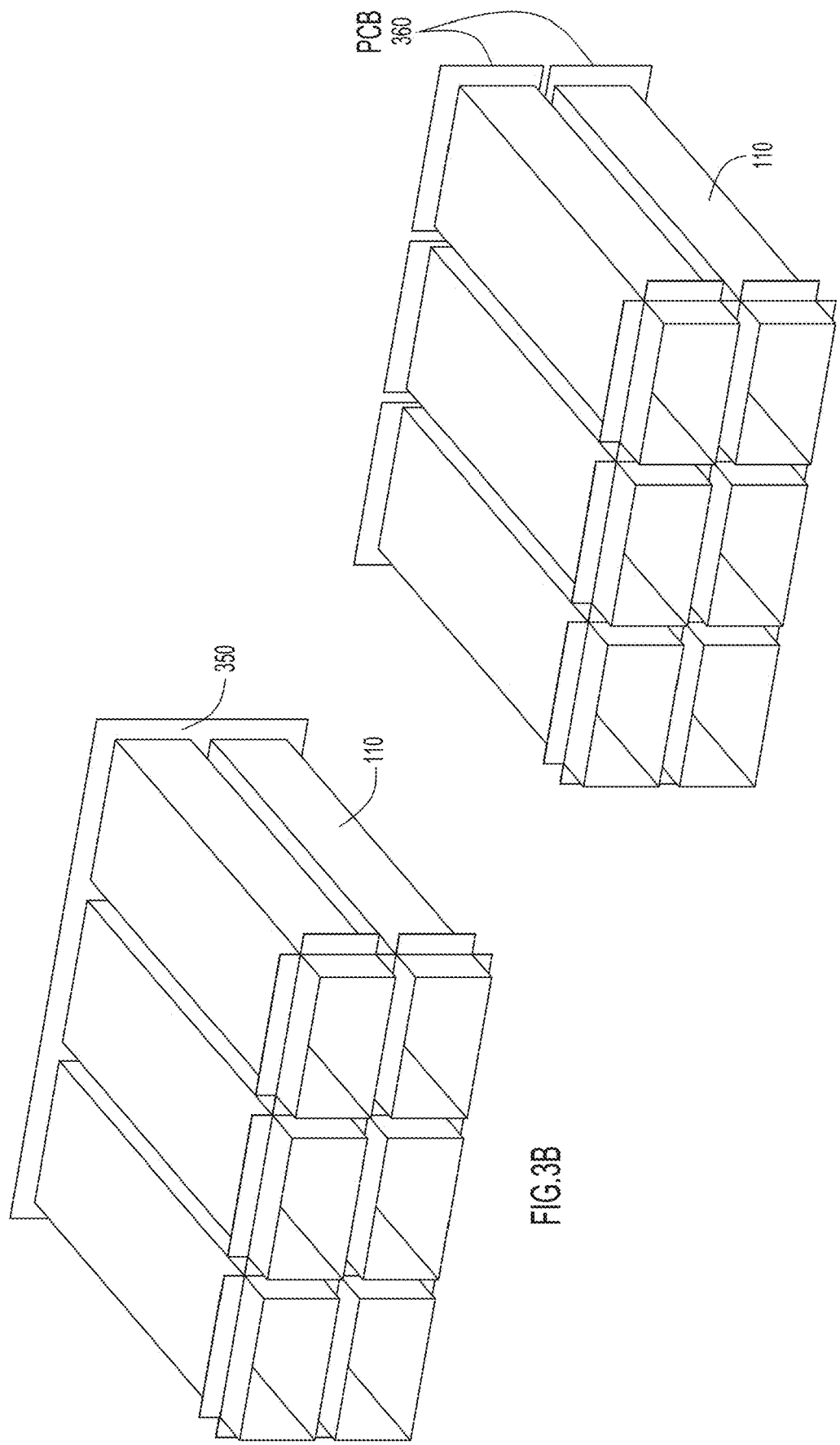

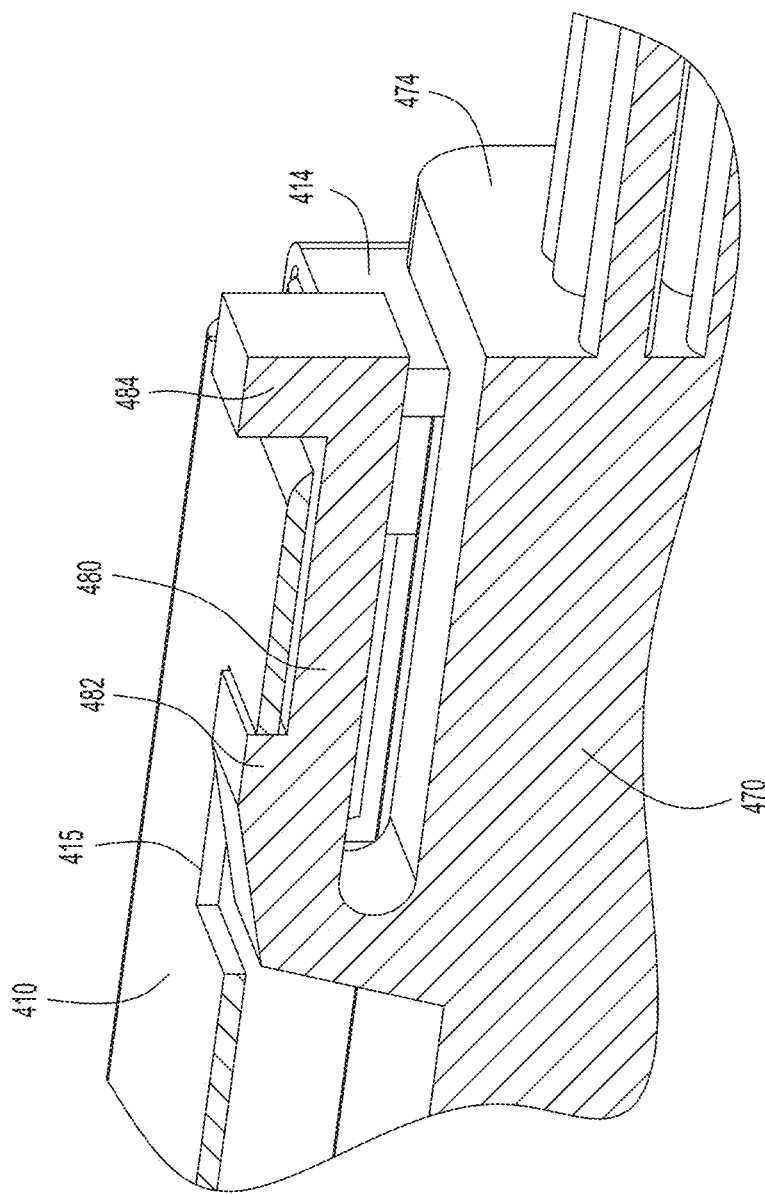

OPTICAL MODULE CAGES MOUNTED FOR OPTIMAL DENSITY AND COOLING

CROSS-REFERENCE TO RELATED APPLICATION

This application is a continuation of U.S. patent application Ser. No. 17/528,415, entitled "Optimal Module Cages Mounted For Optimal Density and Cooling", filed Nov. 17, 2021, which claims priority under 35 U.S.C. § 119(e) to U.S. Provisional Patent Application Ser. No. 63/145,184, entitled "Optical Module Cages With Optimized Density, Cooling, and Mounting", filed Feb. 3, 2021, the disclosures of which are incorporated herein by reference their entireties for all purposes.

TECHNICAL FIELD

The present disclosure relates to module cages that receive optical modules for electronic devices, e.g., in relation to communication networks.

BACKGROUND

Over the years, there has been an increase in the need for higher performance communications networks. To satisfy the increasing demand of bandwidth and speed, pluggable transceiver modules (optical modules) are being used on various network devices (e.g., switches, routers, etc.). The pluggable transceiver modules are used to convert electrical signals to optical signals or in general as the interface to a network element copper wire or optical fiber. Increased performance requirements have also led to an increase in energy use resulting in greater heat dissipation from the pluggable modules.

Pluggable optical modules (transceiver modules) come in many different form factors such as SFP (Small Form-Factor Pluggable), QSFP (Quad Small Form-Factor Pluggable), QSFP+, QSFP-DD (QSFP Double Density), OSFP (Octal Small Form-Factor Pluggable), and the like, and may support data rates up to 400 Gb/s, for example. Hosts for these pluggable modules include line cards or fixed designs that may be used on switches, routers, edge products, and other network devices. The optical modules may operate with heatsinks (e.g., integrated or riding heatsink) or without heatsinks. Single, double, and triple stack optical module cage configurations are typically connected to a printed circuit board with an opening for receiving an optical module positioned such that an optical module is inserted in a horizontal position.

As telecommunication systems speeds and power requirements increase, emission from the pluggable module increases along with a need for improved cooling. Also needed are increased density and flexibility in terms of pluggable configurations.

BRIEF DESCRIPTION OF THE DRAWINGS

FIG. 3A schematically depicts optical module cages (e.g., arranged in an array such as depicted in FIG. 2A or 2B) including cables that connect with a circuit component (ASIC) of an electronic device.

FIG. 3B schematically depicts the plurality of optical module cages as depicted in FIG. 2A directly connected to a printed circuit board (PCB).

FIG. 3C schematically depicts the plurality of optical module cages as depicted in FIG. 2A, where each cage is directly connected to a separate printed circuit board (PCB).

FIG. 5E depicts an enlarged view of FIG. 5D showing engaging structure between the rear end of the optical module cage and edge connector.

DESCRIPTION OF EXAMPLE EMBODIMENTS

Overview

Figure 1A:
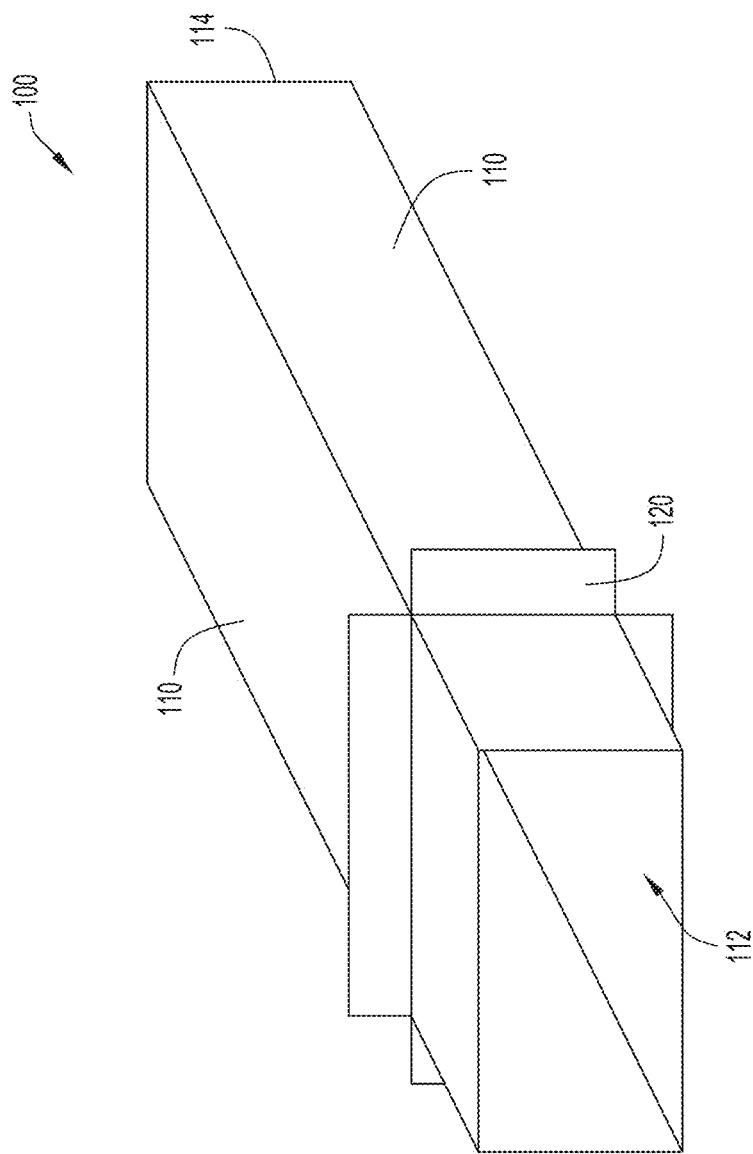
FIG. 1A schematically depicts an optical module cage that secures to a face plate or front panel of the housing (chassis) of an electronic device in accordance with example embodiments described herein.

In example embodiments, an apparatus comprises a housing for an electronic device includes a panel, where the panel includes a window. A cage includes a plurality of panels and a first end and a second end that opposes the first end. The cage further includes an opening at its first end and an enclosure disposed between the panels of the cage. Connecting structure is disposed at the first end of the cage, where the connecting structure secures the first end of the cage to the panel. The cage is suitably dimensioned to receive and retain a portion of an optical module within the enclosure when the optical module is inserted within the opening at the first end of the cage.

In other example embodiments, a cage comprises a plurality of panels that define an enclosure between the panels, a first end including an opening, a second end that opposes the first end, and connecting structure disposed at the first end of the cage, wherein the connecting structure secures the first end of the cage to a panel of a housing. The cage is suitably dimensioned to receive and retain a portion of an optical module within the enclosure when the optical module is inserted within the opening at the first end of the cage.

In further example embodiments, a method comprises providing a cage including a plurality of panels that define an enclosure between the panels, a first end including an opening, and a second end that opposes the first end, facilitating a connection, via connecting structure disposed at the first end of the cage, between the first end of the cage and a panel of a housing for an electronic device such that the cage extends from the first end to the second end in a cantilevered manner from the panel, and facilitating insertion of an optical module into the opening at the first and end into the enclosure of the cage such that the optical module engages with an edge connector disposed at the second end of the cage, wherein the edge connector includes engaging structure that enables an exchange of signals between the optical module and a circuit component within the housing.

EXAMPLE EMBODIMENTS

Embodiments described herein provide an optical module cage mounting configuration that is independent of a printed circuit board mounting system. The embodiments provide one or more of improved density, cooling, mounting, or signal integrity. A modular optical module cage design described herein allows for multiple port configurations. The optical module cage may be designed for compatibility with various optical form factors including SFP, QSFP, OSFP, CFP, CFP2, CFP8, QSFP-DD, or any other current or future form factor.

As described herein, example embodiments provide an optical module cage (e.g., metal cage) that snaps into a face plate or front panel (faceplate) of a chassis or housing of an electronic device. Suitable types of electronic devices are any type of networking device (e.g., hubs, routers, switches, digital line cards, data storage devices and/or other computing devices) associated with communication networks.

In certain example embodiments described herein, the optical module cage does not need to interface directly or at all with a printed circuit board (PCB). The optical module cage may be mechanically fixed to a faceplate without PCB support. Power, ground, control, and data may be provided through interface with a snap-in direct attach cable system. Elimination of the PCB increases options for increased density, enhanced module to module spacing, or both increased density and enhanced module spacing. Improved airflow and density are provided by elimination of the PCB.

In certain embodiments, a snap-in cable system allows a plurality of cables in a pigtail configuration to be mounted to a circuit component, such as an ASIC (Application Specific Integrated Circuit) and/or to a PCB as an assembly. Connectors may then be snapped into the optical module cage or into an orthogonal connector frame to facilitate a suitable connection (e.g., switch fabric interconnect) between an optical module connected or installed within the optical module cage and the circuit component and/or PCB. The pigtails may be snapped into the optical module cage, which allows for the other end to be directly press-fit attached to circuit component and/or PCB via a suitable connection or engaging structure at the circuit component/PCB end (e.g., pin field and/or any other suitable contact members). This facilitates ease of connector changes and cabling changes based on module speed requirements, without any changes to the optical module cage assembly/front panel mounting system. The snap-in pigtail cable connector structure allows for lower cost connectors or other speed/style connectors to be used and easily mixed and matched in a system design. In addition, implementation of cables instead of direct connection with the PCB provides an improvement in SI (signal integrity) performance. In certain embodiments, the cabling may comprise graphene integrated copper.

In certain embodiments described herein, the optical module cage is mounted in a vertical orientation (plane), where the width or longer dimension of the opening of the optical module cage for receiving an optical module is positioned in a vertical orientation. This allows for an increased stack of mounting of the optical module cages, increased density, or greater spacing between optical modules. Increased spacing allows more room for cooling airflow, thereby making way for deployment of high power optical modules.

Figure 1B:
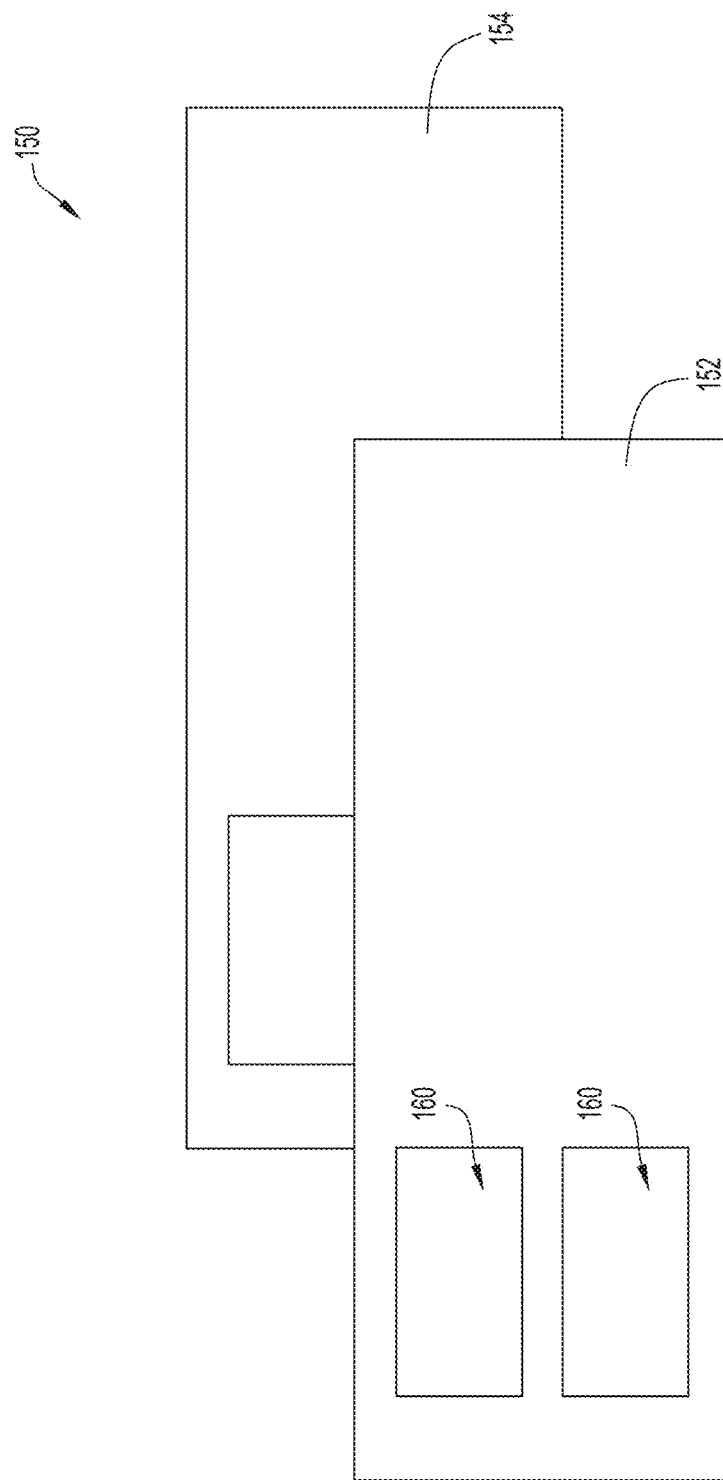
FIG. 1B schematically depicts the front panel of the housing for the electronic device including inner and outer panel portions in accordance with example embodiments described herein.
Figure 1C:
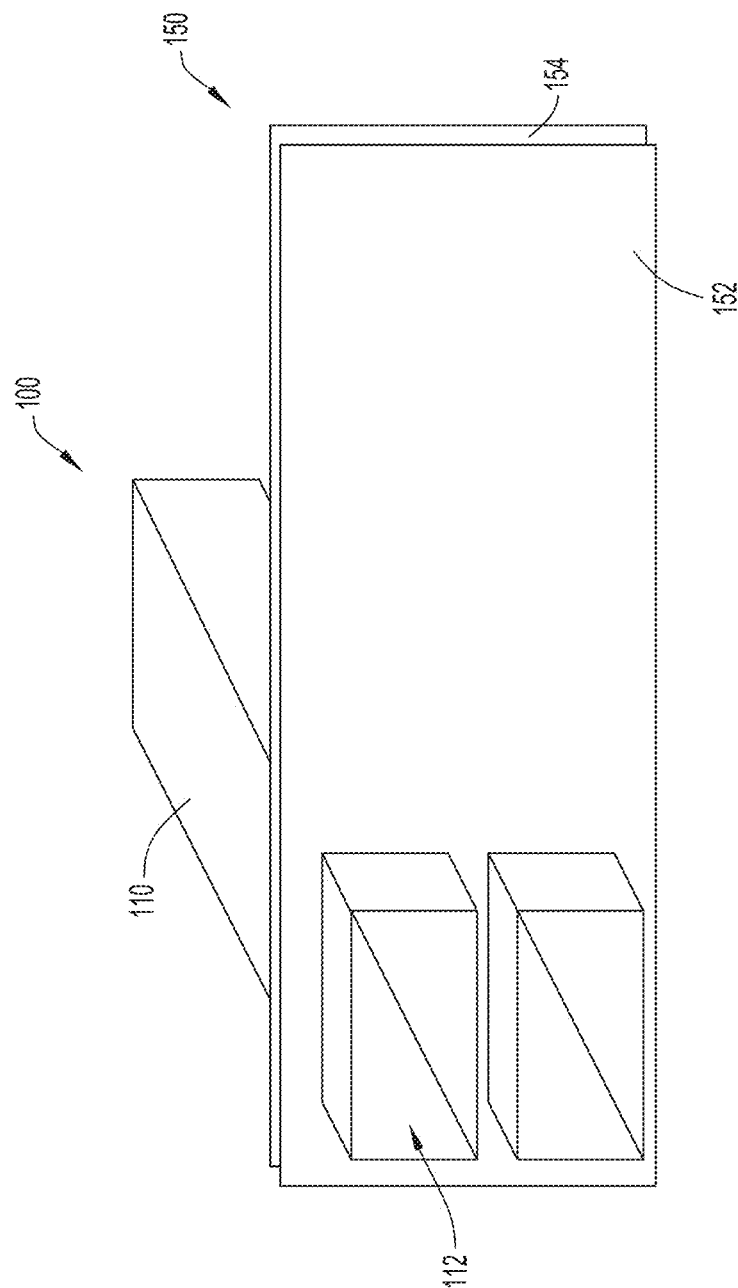
FIG. 1C schematically depicts an optical module cage as set forth in FIG. 1A secured to the front panel of FIG. 1B.

Referring to the drawings, FIGS. 1A, 1B and 1C schematically depict an optical module cage and its connection with the face plate or front panel of the chassis or housing of an electronic device (e.g., an electronic device for a networking/communications system). The optical module cages as described herein can be constructed of any suitably rigid materials (e.g., metals, hard plastic materials, etc.) that provide adequate support for optical modules and connection structure that engage with the cages as described herein. The panels that form the walls of the housing are also constructed of metal and/or any other suitable materials that provide sufficient structural support and protection for the optical module cages as well as components disposed within the housing. While not shown in some of the figures, it is understood that the housing of an electronic device has a generally rectangular shape and includes four sidewalls or side panels, including a front panel that includes windows or connection ports for connecting (e.g., via cables or other transmission lines) with other devices. The housing of the electronic device further includes a top wall or top panel and a bottom wall or bottom panel which, when combined with the side panels, provides an enclosure for one or more printed circuit boards (PCBs) mounted along an interior surface of one or more of the panels as well as electronic components (e.g., an ASIC) (e.g., components mounted and/or integrated with one or more of the PCBs) that perform the operations of the device. The front panel, rear panel, and side panels of the housing all extend between the top and bottom panels.

As shown in FIG. 1A, an apparatus includes an optical module cage and a panel of a chassis or housing of an electronic device (e.g., a front panel or face plate of the housing). In particular, an optical module cage 100 has a generally rectangular shape and includes panels 110 that extend a length of the cage and define sidewalls, a top wall and a bottom wall of the cage with a cavity or enclosure there between. The cage 100 is open at each of a first end or front end 112 and an opposing second end or rear end 114, where the front end opening and rear end opening are each generally rectangular in shape. The cage 100 includes a plurality of flexible flanges 120 comprising thin plates that are located near the front end 112 and that extend transversely from each panel 110. For simplification, airflow perforations are not shown in the cage or flange. However, it is noted that openings or perforations can be provided anywhere and in any configurations, sizes, patterns, etc. along any of the panels of the cage to facilitate cooling of an optical module inserted within the cage.

A front panel 150 for the housing of the electronic device is schematically depicted in FIG. 1B and includes front plate or front wall 152 and a rear plate or rear wall 154, where each of the front and rear walls includes a plurality of rectangular cut-outs or windows 160 that align with the windows 160 on the other plate so as to correspond when the two plates are brought together (as shown in FIG. 1C). The windows 160 are further suitably dimensioned to receive and permit a portion of the optical module cage 100 including its front end 112 to extend through the front and rear walls 152, 154. This structural configuration as depicted in FIGS. 1A-1C facilitates a connection of the optical module cage 100 with the front panel 150 of the electronic device housing, where the flanges 120 of the cage are fit between the front wall 152 and the rear wall 154 so as to secure the cage 100 with the front panel 150 with a portion of the cage including the front end 112 extending beyond the front wall 152. In this configuration shown in FIG. 1C, the front wall 152 defines an exterior surface of the front panel 150 through which a portion of the cage 100 including its front end 112 extends (thus permitting insertion of an optical module within the cage and connection with one or more circuit components within the housing of the device as described herein).

As shown in FIGS. 1B and 1C, the front panel 150 of the electronic device housing can be configured so as to accommodate and support a plurality of optical module cages in any suitable grouping or array of cages in a stacked manner and/or a side-by-side manner. The term "stacked" as used herein refers to one optical module cage positioned in a location vertically above another cage, and the term "side-by-side" as used herein refers to two cages positioned horizontally adjacent to one another. It is to be understood that the terms above/below, upper/lower, top/bottom, horizontal/vertical, or front/rear as used herein are relative to the position of the cage in relation to the electronic housing and also cover other orientations of the cage. Thus, the terms are used only for ease of description and are not to be interpreted as limiting the arrangement of optical module cages.

Figure 2A:
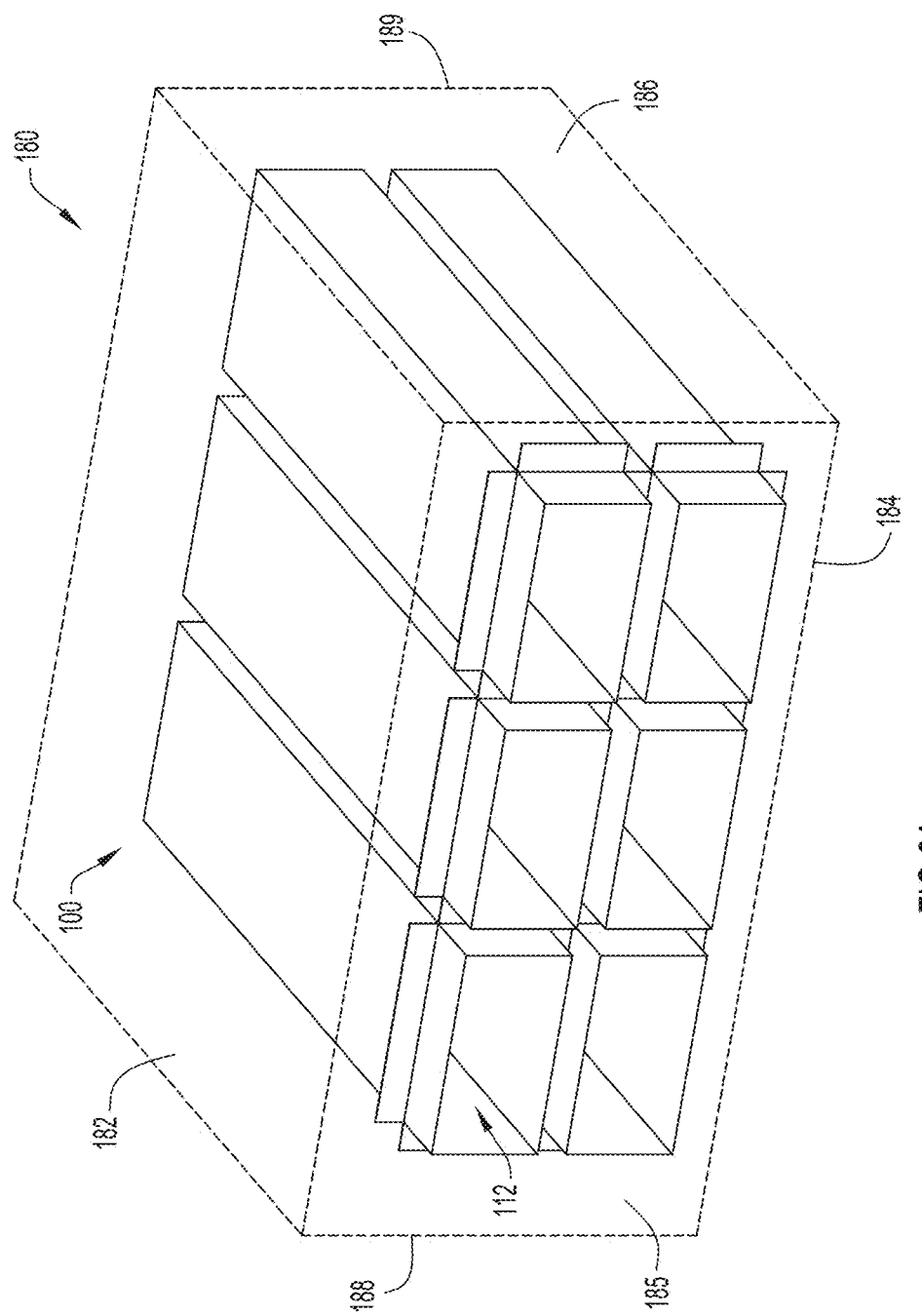
FIGS. 2A and 2B schematically depict a plurality of optical module cages in a 3×2 array and a 2×3 array arranged along a front panel of a housing for an electronic device in accordance with example embodiments described herein.
Figure 2B:
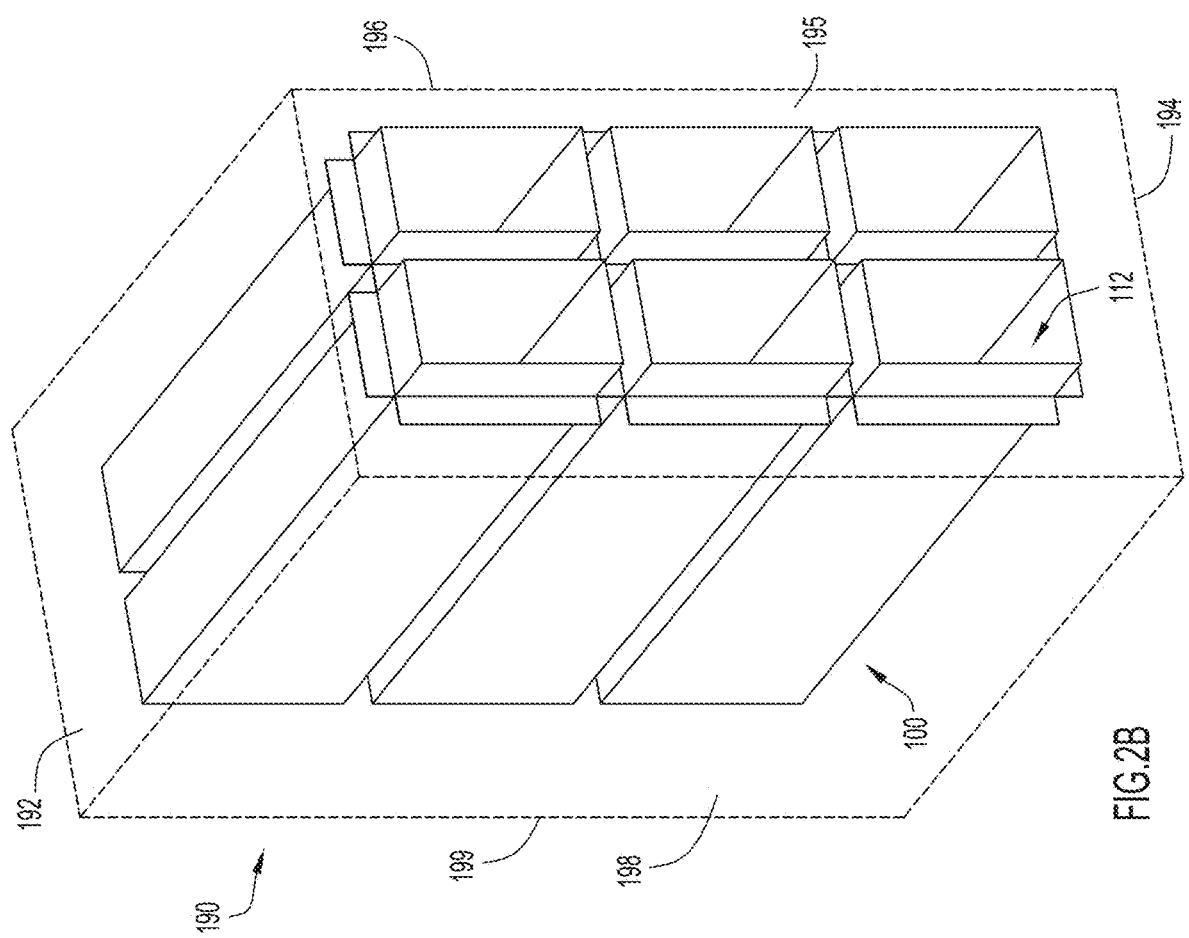

For example, FIG. 1C depicts a 2×1 arrangement of 2 cages (2 rows displaced from each other, each row including a single cage) along the front panel 150. In the example embodiments of FIGS. 2A and 2B, an arrangement of six optical cages are shown in which the front panel of the device housing can be constructed so as to accommodate such grouping of cages. In each of FIGS. 2A and 2B, a chassis or housing including the front panel is depicted in phantom lines to show how the cages are arranged or aligned (horizontally and vertically) in relation to the alignment of the device housing. In FIG. 2A, the arrangement shows a 2×3 array of cages (i.e., 2 rows, each row including 3 cages). In FIG. 2B, the arrangement is rotated 90° to be a 3×2 array of cages (i.e., 3 rows, each row including 2 cages). In particular, the array of optical module cages depicted in FIG. 2A is a horizontal arrangement in relation to the device housing, where the housing 180 includes a top panel 182, a bottom panel 184 that opposes the top panel 182, side panels 186 and 188 that oppose each other and extend between the top and bottom panels, a rear panel 189 that extends between the top and bottom panels, and a front panel 150/185 that opposes the rear panel and extends between the top and bottom panels. The cages 100 are disposed within windows of the front panel 150/185. A lengthwise dimension of the rectangular opening at the front end 112 for each cage 100 generally corresponds or is parallel with the top panel 182 and the bottom panel 184 of the housing 180. The array of optical module cages depicted in FIG. 2B is a vertical arrangement in relation to the device housing, where the housing 190 includes a top panel 192, a bottom panel 194 that opposes the top panel 192, side panels 196 and 198 that oppose each other and extend between the top and bottom panels, a rear panel 199 that extends between the top and bottom panels, and a front panel 150/195 that opposes the rear panel and extends between the top and bottom panels. The cages 100 are disposed within windows of the front panel 150/195. A lengthwise dimension of the rectangular opening at the front end 112 for each cage 100 transverses (e.g., is orthogonal with) the top panel 192 and the bottom panel 194 of the housing 190. It is further noted that the front panel of the device housing can be constructed so as to receive any number of optical module cages in any arrangement (e.g., in a stacked or side-by-side arrangement, e.g., 2×1, 2×2, 2×3, etc.) as well as any orientations (horizontal or vertical) of the cages.

Referring to FIG. 3A, a pair of optical module cages 100 are schematically depicted, where each cage includes a module edge connector system 200 located at its rear end 114 and cables 250 that connect between the module edge connector system 200 and a circuit component 300 (e.g., an ASIC). When an optical module is fully inserted into the opening at the front end 112 of a cage 100, the module includes engaging structure at its rear end that engages and connects with complementary engaging structure the module edge connector system 200 (e.g., engaging structure may utilize a via/pin combination and/or any other suitable connection mechanism to achieve a suitable connection) to facilitate transfer or exchange of signals (e.g., electrical signals, optical signals, or a combination of electrical and optical signals) between the optical module and the circuit component 300 via the edge connector system 200 and the cables 250.

In other embodiments, such as shown in FIGS. 3B and 3C, the optical module cages can connect directly, via a module edge connector system at the rear ends of the cages, to a circuit component (e.g., a pin field for an ASIC) or a PCB. Referring to FIG. 3B, all of the optical module cages 100 in a 2×3 array connect with a single PCB 350. In the embodiment of FIG. 3C, each optical module cage 100 in the 2×3 array connect with an individual (separate) PCB 360. While connection directly to a PCB is available utilizing the optical module cage connection structure (edge connector) as described herein (where the optical module cages connect directly to the front panel of the electronic device housing), such embodiments can result in reduced airflow around and through the cages due to their close alignment and connection with the PCB. A cable connection system, such as that depicted in FIG. 3A, facilitates a greater ability for airflow around the cages as well as the provision of heat sink structure or heat sink components on one or more sides of each cage as described in further detail herein. Utilization of a cable connection system also enables direct attachment of the cables with the module edge connector system as well as circuit components at a variety of different angles (e.g., at 90°, 180°, 45°, or 22° to 45°), thus providing more flexibility in arrangement of optical module cages as well as circuit components within the housing of the device.

Figure 4A:
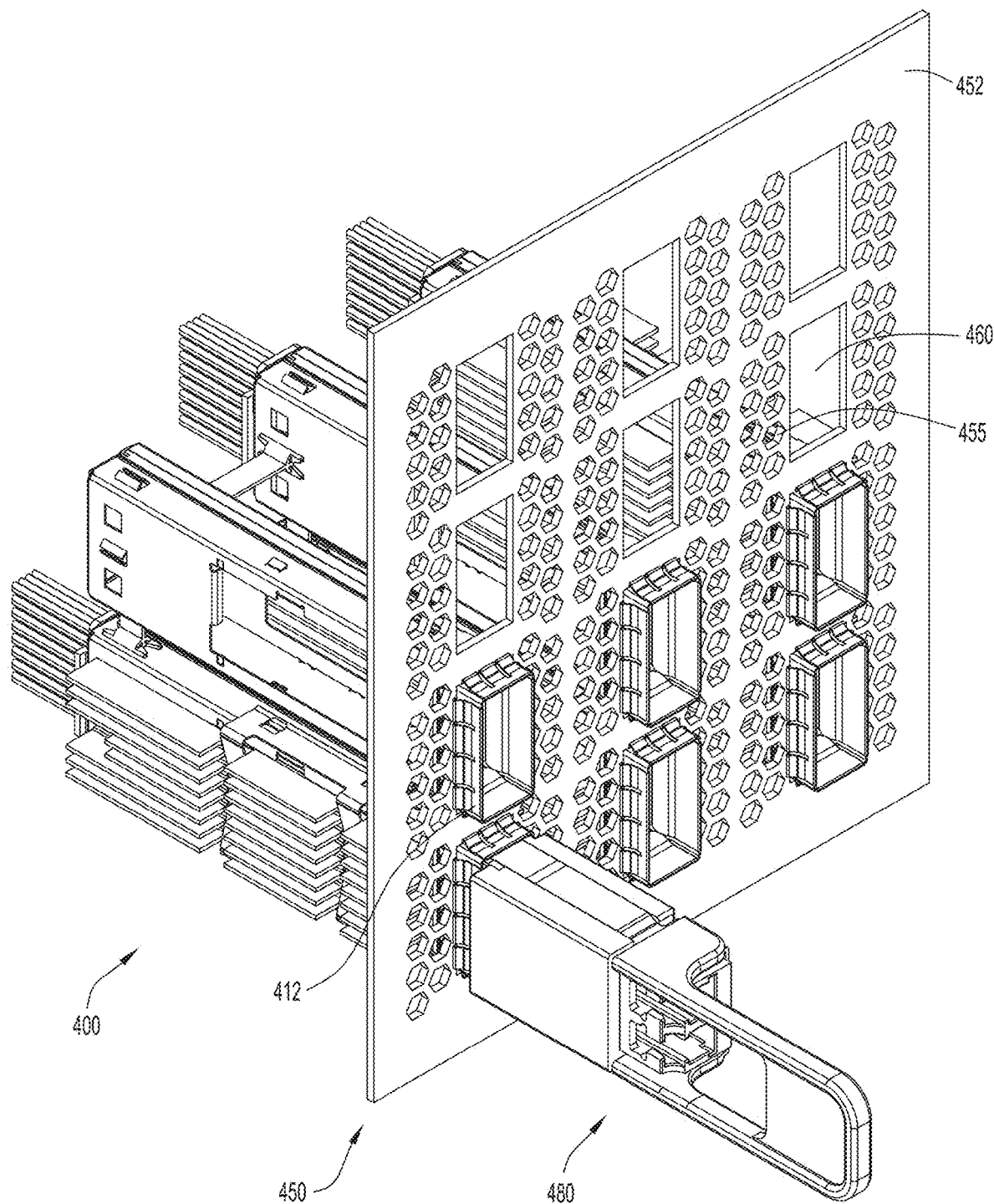
FIGS. 4A and 4B depict a plurality of optical module cages connected with a front panel of a housing (chassis) of an electronic device in accordance with example embodiments described herein, where the outer or exterior surface of the front panel is depicted in FIG. 4A (with an optical module installed within one of the cages) and the inner or interior surface of the front panel is depicted in FIG. 4B.
Figure 4B:
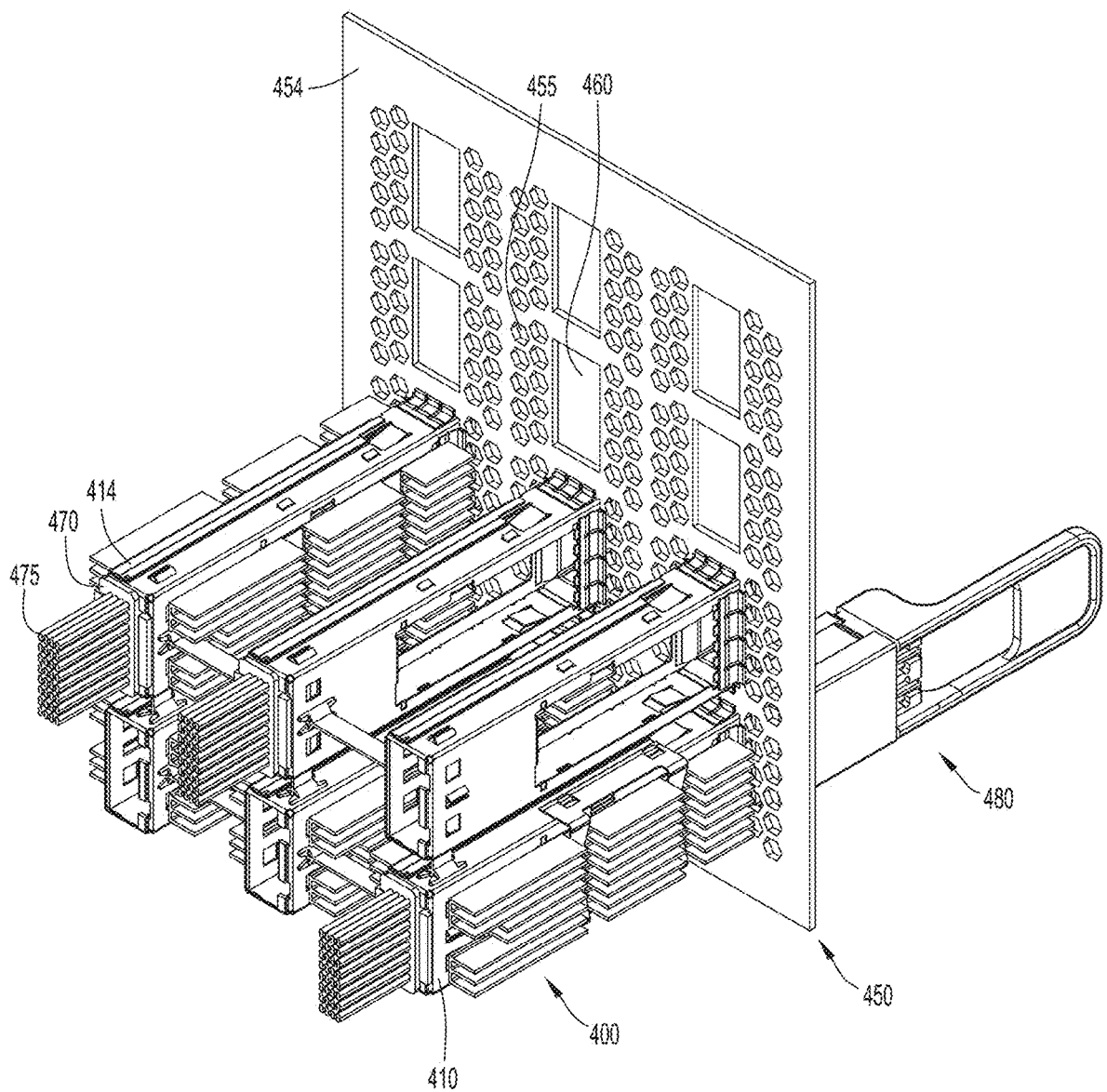

In other example embodiments, the connection structure for the optical module cages is configured to connect with a front panel of the device housing that includes a single wall. Referring to FIGS. 4A and 4B, an embodiment is depicted in which optical module cages 400 are connected to the front panel 450 of a chassis or housing of an electronic device. As described in further detail herein, each optical module cage 400 includes at its front end 412 flexible connecting structure that facilitates a connection of the cage at its front end within an opening or window 460 at the front panel 450. Similar to the schematic depictions in FIGS. 1-3, each optical module cage 400 has a generally rectangular configuration and includes panels 410 that extend a length of the cage and define sidewalls, a top wall and a bottom wall of the cage with a cavity or enclosure there between, where each of a front end 412 and a rear end 414 of the cage includes an opening. The front end 412 of the cage, when connecting within an window 460 of the front panel 450, extends beyond the exterior surface 452 of the front panel while the remaining portion of the cage extends beyond the interior surface 454 of the front panel such that the rear end 414 of the cage is floating or free of support (i.e., the cage extends from its front end to its second end in a cantilevered manner from the panel, with only the front end being connected to a panel of the housing). The interior of each cage 400 is further suitably dimensioned to receive and retain a portion of an optical module 500 that is inserted into the opening at the front end 412 of the cage. The opening at the rear end 414 of the cage 400 is configured to receive and couple with structure comprising an edge connector 470, where the edge connector 470 includes an interior surface connector with suitable engaging structure that connects with complementary engaging structure at a rear end of an optical module inserted within the cage and an exterior surface that includes cables 475 that connect with a PCB or circuit component (e.g., an ASIC or other circuit component as schematically depicted in FIG. 3A). As can be seen in the embodiment of FIGS. 4A and 4B, the front panel 450 includes a plurality of apertures or perforations 455 that extend through the front panel and serve as air vents for the housing.

Figure 4C:
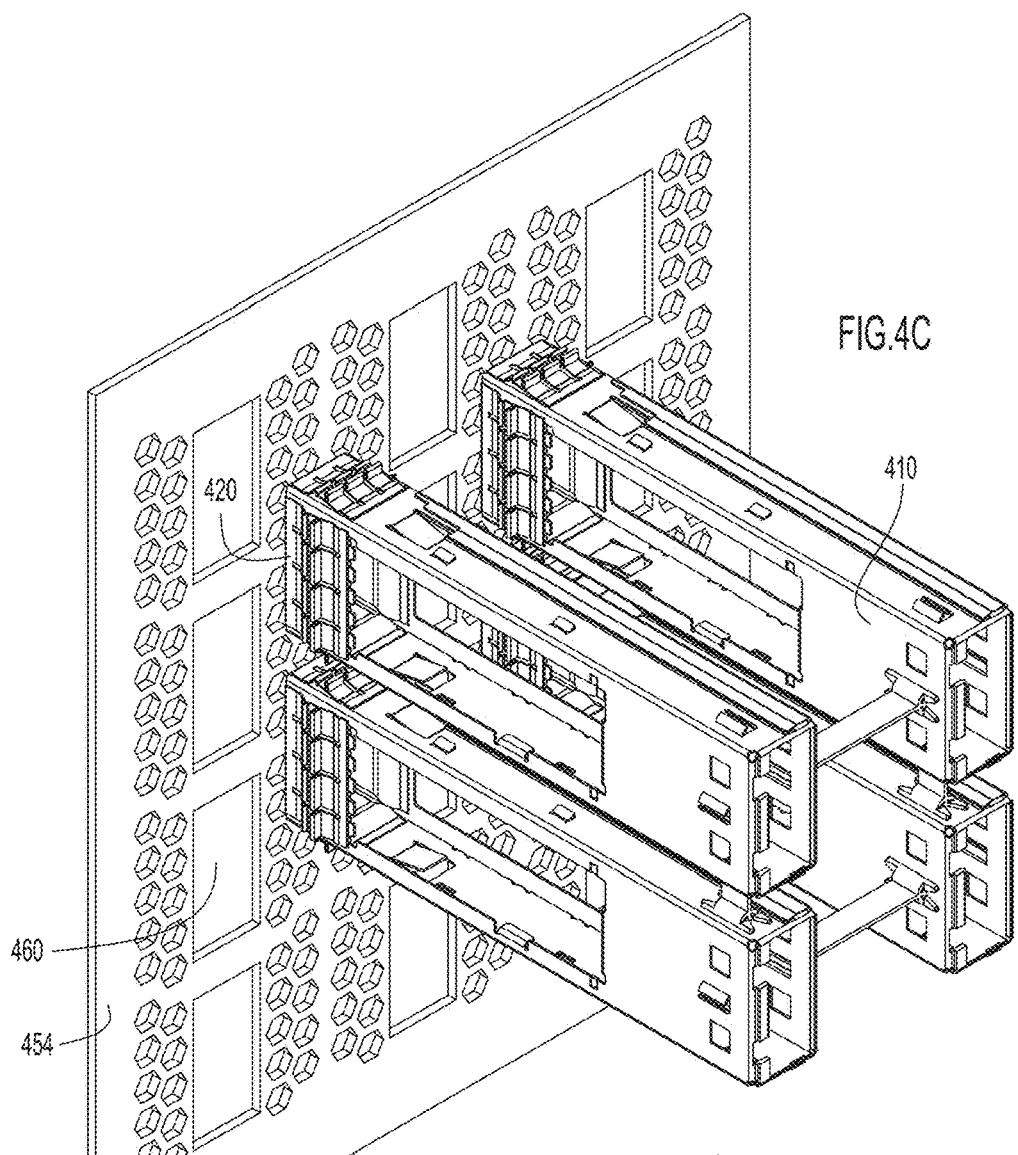
FIG. 4C depicts optical module cages and a portion of the front panel as shown in FIG. 4B, in which the optical module cages are separated from the front panel prior to installation with the front panel.
Figure 4D:
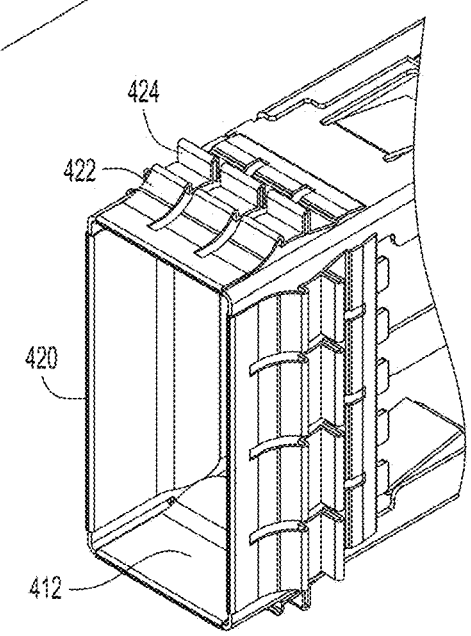
FIG. 4D depicts a portion of an optical module cage as shown in FIG. 4C at its front end.
Figure 4E:
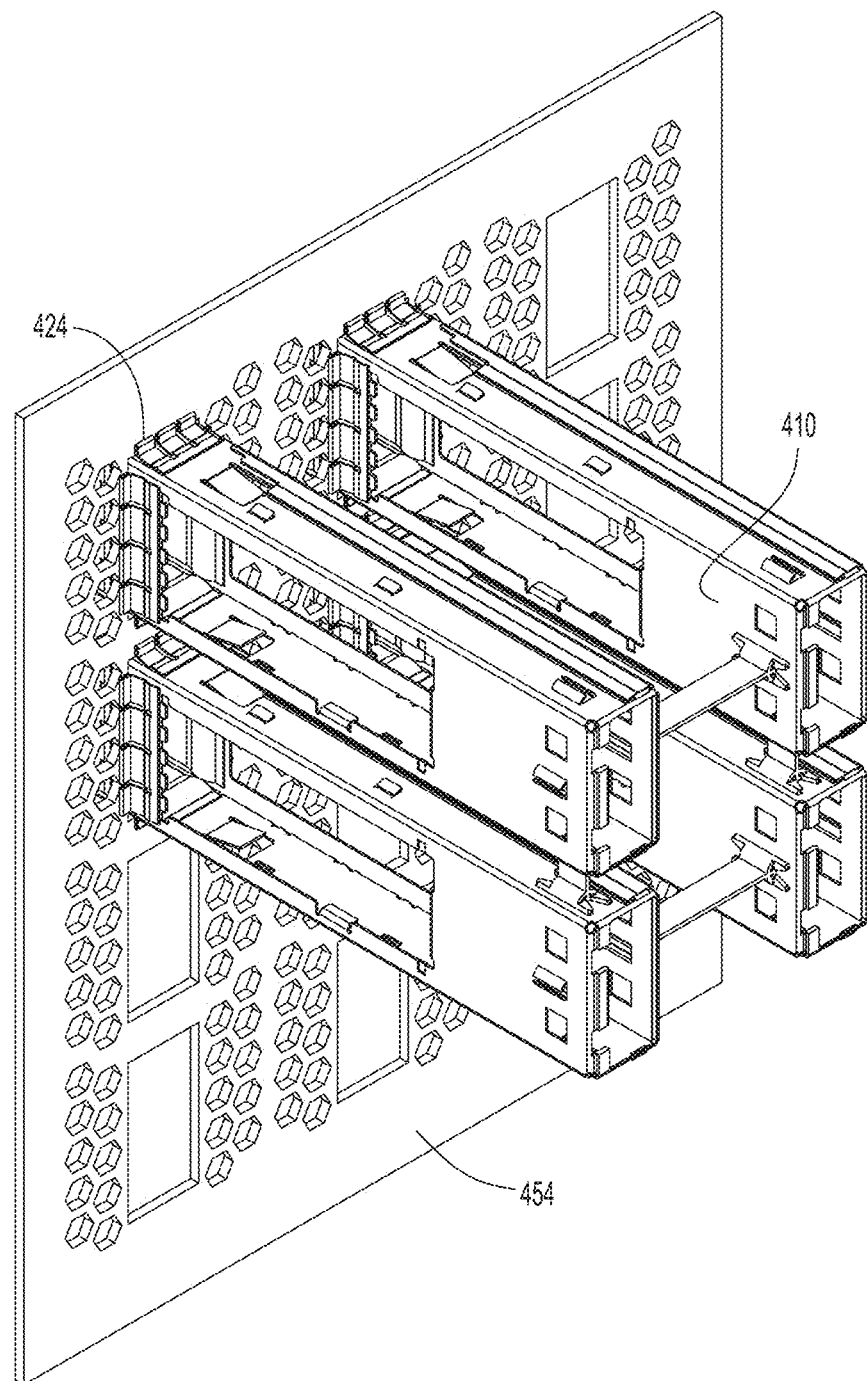
FIG. 4E depicts optical module cages and a portion of the front panel as shown in FIG. 4B, in which the optical module cages are connected with the front panel.

Referring to FIGS. 4C, 4D and 4E (and also FIG. 6A), each optical module cage 400 includes connecting structure 420 at its front end 412 that facilitates a connection between the cage and the front panel 450 within a corresponding window 460. The connecting structure comprises a row of flexible front flanges or front fingers 422 disposed along and extending transversely from each panel 410 at the front end 412 and also a row of flexible rear flanges or rear fingers 424 disposed directly behind the row of front fingers 422 (i.e., between the front fingers 422 and the rear end 414 of the cage 400) and also along and extending transversely from each panel 410. The front fingers 422 can have a slightly angled profile and a sufficient flexibility that allows the front flanges to slightly flex or bend when the front end 412 of the optical module cage 400 is inserted through an window 460 (e.g., at the interior surface 454) of the front panel 450. Each cage 400 secures to the front panel 450 at a corresponding window 460 with the row of front fingers 422 extending slightly beyond and engaging with the exterior surface 452 while the row of rear fingers 424 extend slightly beyond and engage with the interior surface 454. This allows for a snap-in type of securing connection between each optical module cage 400 at its front end 412 and the front panel 450 of the device housing, with the rear end 414 of the cage floating such that the cage is cantilevered in relation to the front panel (i.e., the cage is secured to the housing only at the front panel).

The front fingers 422 and the rear fingers 424 can be constructed of any suitable materials meeting EMC/EMI (electromagnetic interference/electromagnetic compatibility) compliance for the device and its environment of use. It is noted that any other suitable connection structure can also be provided at the front end of each optical module cage to facilitate securing of the cage to the front panel of the device housing. For example, in an alternative example embodiment, one or more cages can be connected with the front panel via flanges and threaded fasteners (e.g., screws).

Figure 5A:
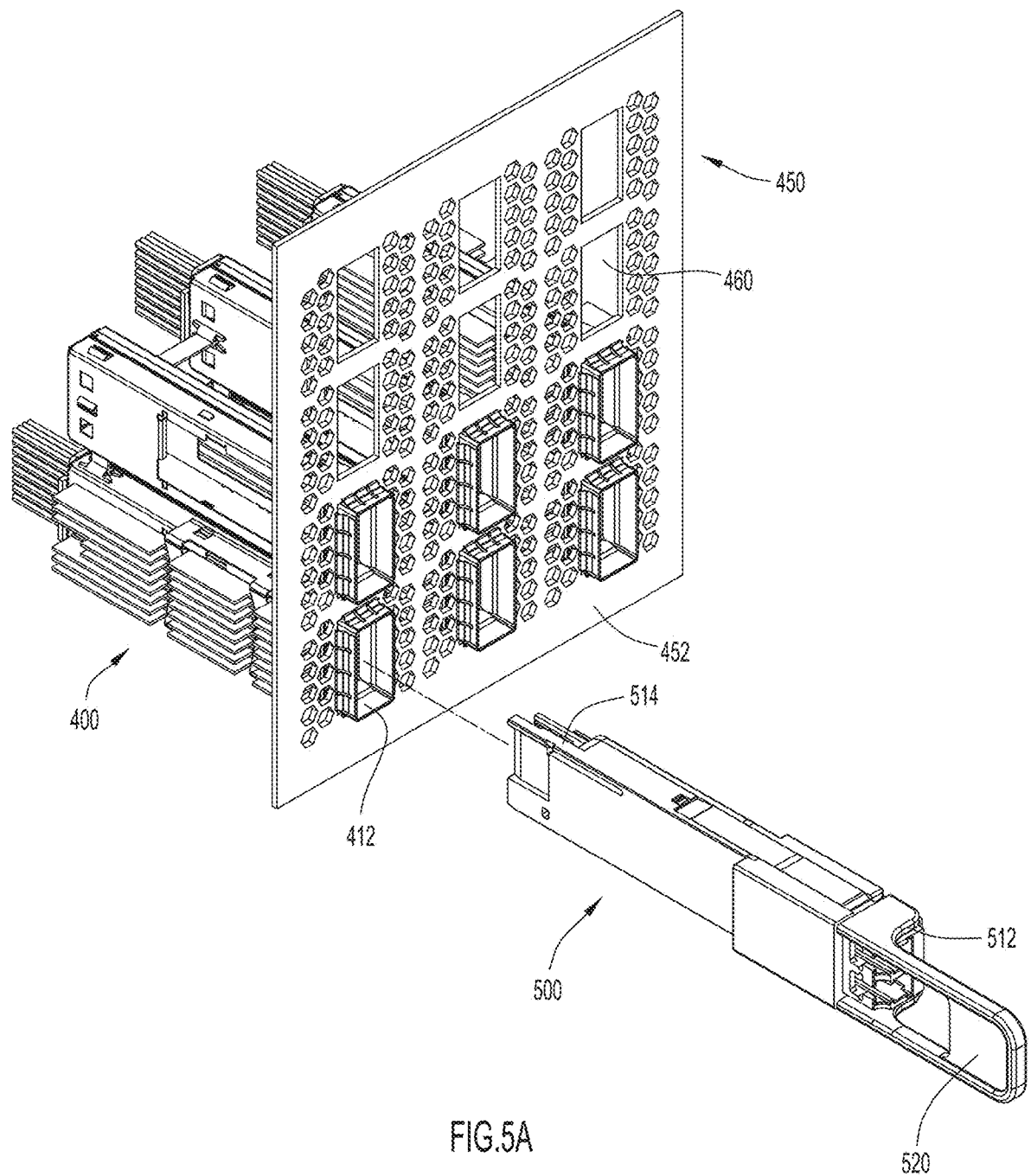
FIG. 5A depicts a front view of the front panel of a chassis or housing of an electronic device with optical module cages connected with the front panel and an optical module prior to insertion/installation within one of the cages.
Figure 5B:
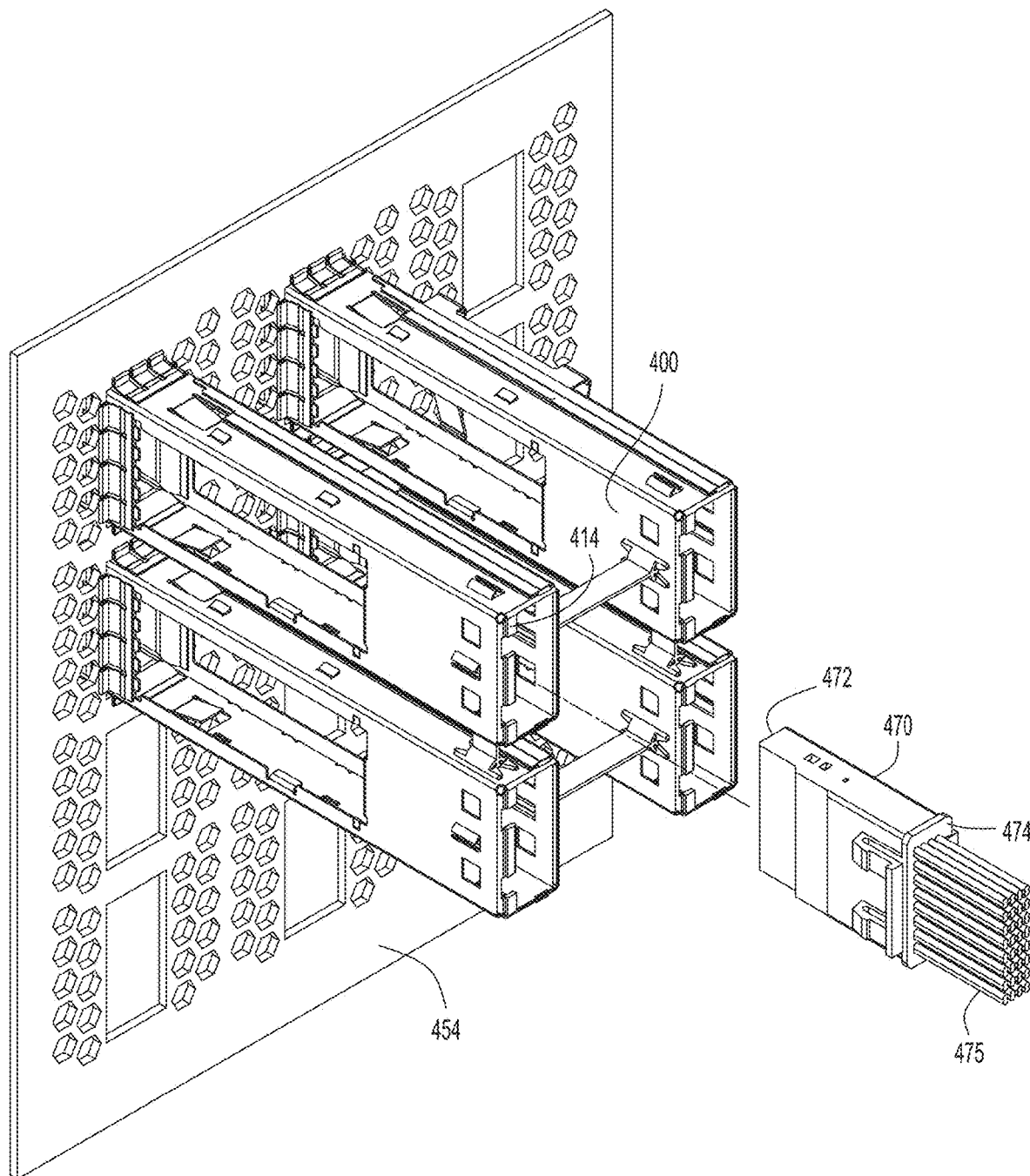
FIG. 5B depicts a portion of a rear view of the front panel of FIG. 5A, and further showing structure comprising a snap-in edge connector including cables prior to connection/assembly with a rear end of an optical module cage in accordance with example embodiments described herein.
Figure 5C:
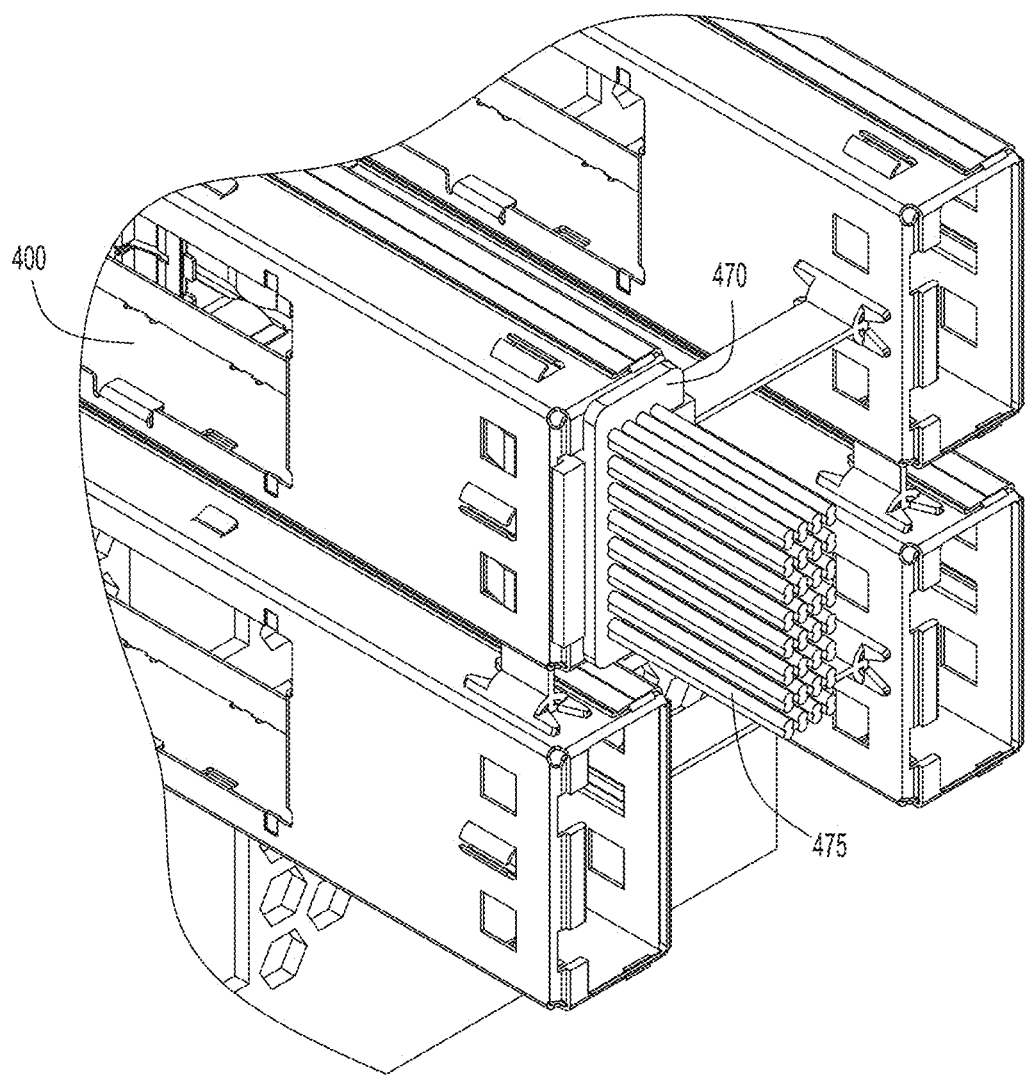
FIG. 5C depicts the view of FIG. 5B in which the snap-in connector structure is connected with the rear end of the optical module cage.
Figure 5D:
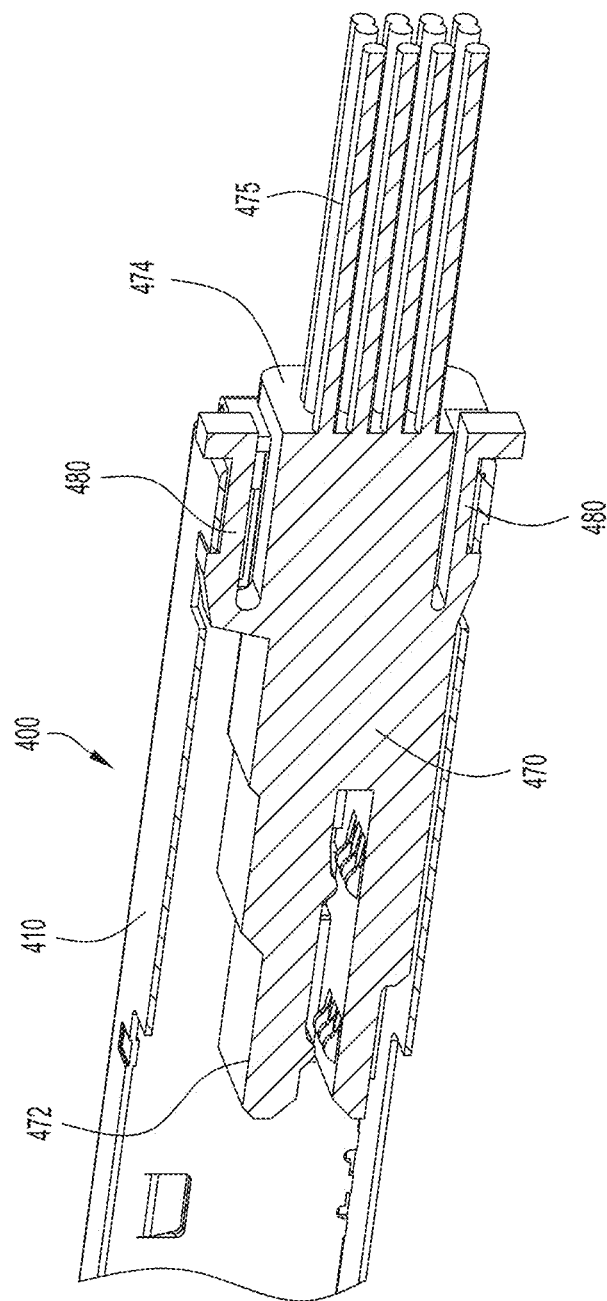
FIG. 5D depicts cross-sectional views of a portion of an optical module cage and an edge connector coupled with the cage at its rear end.

An optical module 500 is depicted in FIG. 5A prior to insertion/installation within the enclosure of a cage 400 at its front end 412. As previously noted herein, the optical module can have any suitable optical form factor that corresponds with the cage and cable connector structure couple with the cage, including, without limitation, form factors such as SFP, QSFP, OSFP, CFP, CFP2, CFP8, QSFP-DD. The optical module 500 has a generally rectangular shape that corresponds with the cage enclosure and includes a front end 512 that can include a handle 520 or any other suitable structure that facilitates ease of insertion and removal of the module from the cage. A rear end 514 of the optical module 500 is inserted into the opening at the cage front end 412. The module rear end 514 includes engaging structure that connects with the interior surface engaging structure of the edge connector 470 coupled with the cage 400 at its rear end 414 to facilitate transfer or exchange of signals (e.g., electrical signals, optical signals, or a combination of electrical and optical signals) between the optical module 500 and the edge connector 470 (where the edge connector 470 transfers such signals, via cables 475, to one or more circuit components and/or a PCB within the device housing).

Referring to FIGS. 5B, 5C, 5D and 5E, the edge connector 470 with cables 475 can be constructed so as to include locking or mechanical connection structure at a forward end 472 of the edge connector, where the connection structure at the forward end 472 corresponds with complementary connection structure at the rear end 414 of the cage 400. The rear end 474 of the end connector 470 includes the cables 475 extending therefrom and which extend to connect with one or more circuit components and/or PCBs within the device housing. The forward end 472 of the edge connector 470 includes suitable engaging structure that facilitate a connection with complementary engaging structure at the rear end 514 of the optical module 500 to enable transfer of signals (optical and/or electrical signals) therebetween.

In an example embodiment, the connection structure at the corresponding ends of the edge connector and the cage facilitates a frictional locking connection or a snap-tight locking engagement in which one or more tabs of the connection structure for the edge connector engage and lock with complementary grooves or notches at the rear end of the cage. As best shown in FIG. 5E (an enlarged cross-sectional view at the rear end 414 of the cage), the forward end 472 of the edge connector 470 includes a flexure arm 480 that is cantilevered from the main body of the edge connector. The flexure arm 480 includes a forward aligned tab 482 and a rearward aligned raised member or stop member 484 (located at the terminal, free end of the flexure arm). The top wall or panel 410 of the cage 400 includes a groove, notch or slot 415 near the rear end 414 of the cage that is suitably aligned and dimensioned to receive the tab 482 of the flexure arm 480 when the edge connector 470 is inserted into the opening at the rear end 414. Upon full insertion of a portion of the edge connector 470 including its forward end 472 into the opening of the cage 400 at its rear end 414, the flexure arm 480 is slightly depressed allowing tab 482 to slide and fit within the slot 415 of the top wall or panel 410 of the cage and stop member 484 abuts a portion of the rear end 414 of the cage thus achieving the snap-tight locking engagement and preventing further inward movement as well as outward movement of the edge connector in relation to the cage. Release of the locking engagement and removal of the edge connector 470 from the cage 400 is also easily facilitated by pressing the flexure arm 480 (e.g., via the stop member 484 exposed at the rear end 414 of the cage) so as to release the tab 482 from its locking engagement with the slot 415 and allowing the edge connector to be removed from the cage. As further shown in FIGS. 5D and 5E, the edge connector 470 includes a pair of flexure arms 480 that correspond with top wall and bottom walls or opposing panels 410 of the cage 400 (each of which includes a corresponding groove or slot 415), where operation of each flexure arm operates in the same or similar manner to provide a releasable snap-tight locking engagement with the cage.

It is noted that the snap-tight releasable locking engagement between the edge connector and the cage as depicted in FIGS. 5B-5E is an example embodiment and the optical module cage system and apparatus as described herein are not limited to such embodiment (i.e., other structural configurations that facilitate a suitable engagement between cage and edge connector may also be implemented). Providing a releasable locking engagement between the optical module cage at its rear end and the edge connector facilitates ease of changing the edge connector based upon different modules being inserted within the cages.

The connection of optical module cages with the front panel (or any other wall or panel) of the chassis or housing of an electronic device facilitates orientations of the cages in any configurations (e.g., horizontal or vertical) and arrays along the housing panel. For example, as noted herein and as shown schematically in FIG. 2B, the cages can be vertically oriented along a front panel of the device housing (i.e., where each cage is oriented along the front panel such that the rectangular opening at its front end has a lengthwise dimension that is transverse the top and bottom walls or panels of the device housing), and this can allow for a larger number and/or density of cages while also permitting adequate airflow (for cooling purposes) along the panels at each side of the cages. Such configurations of cages can also allow for heat sink components to be provided along two or more panels (i.e., along two or more sides) of one or more cages in an array.

Figure 6A:
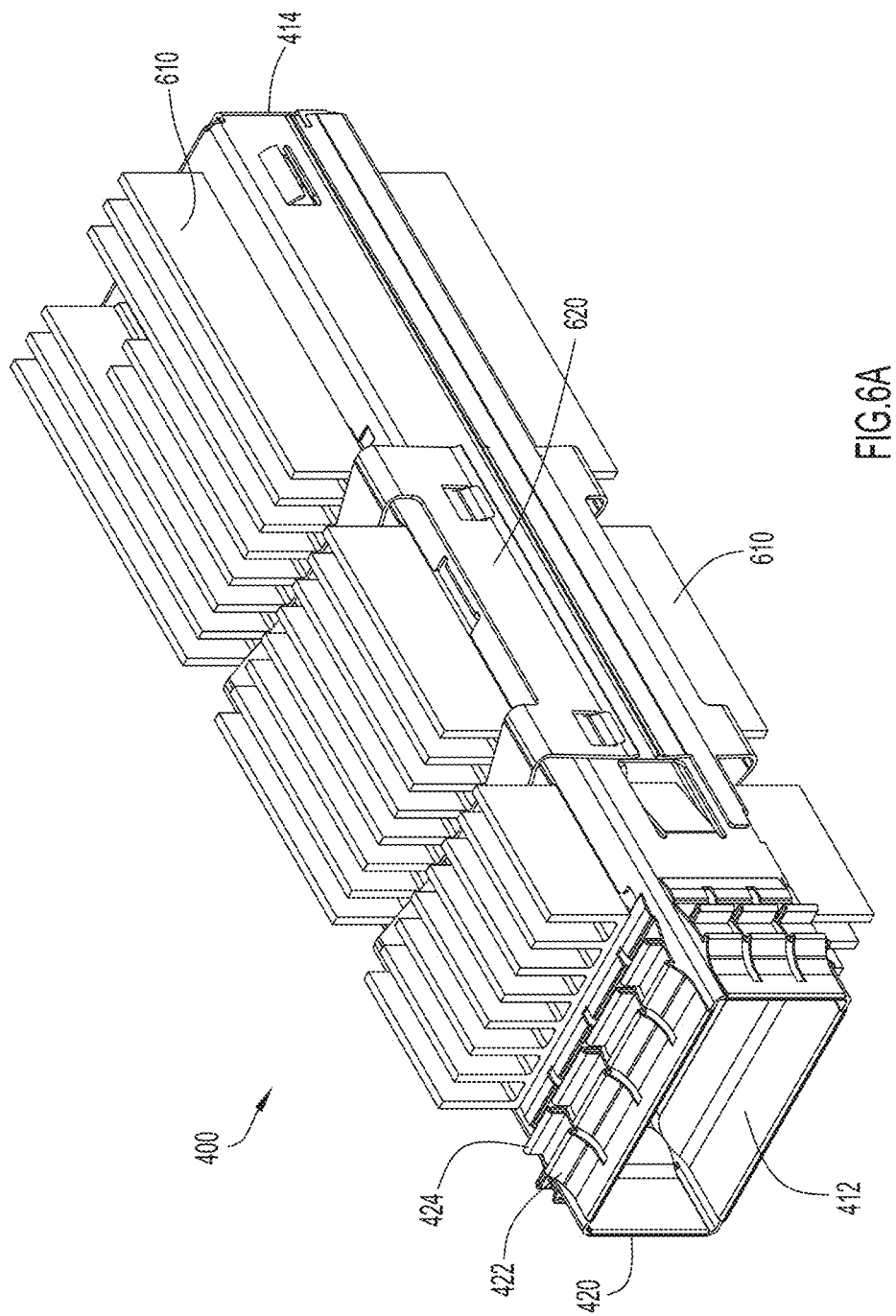
FIG. 6A depicts an isolated view in perspective of an optical module cage in accordance with example embodiments of the invention and in which the cage includes heat sink components (fins) disposed along opposing sides of the cage.
Figure 6B:
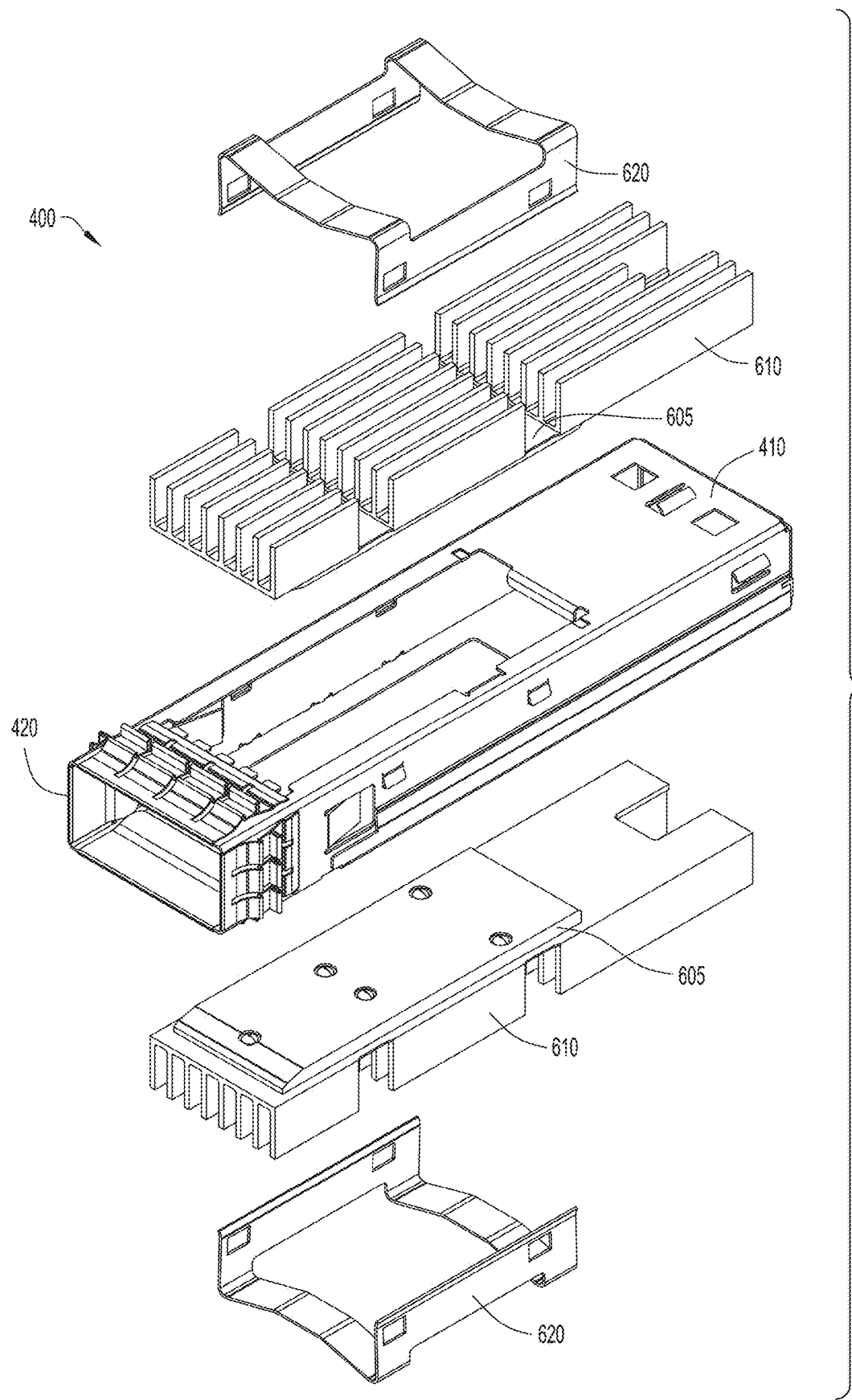
FIG. 6B depicts an exploded view in perspective of the optical module cage of FIG. 6A.

For example, referring to FIGS. 6A and 6B, an optical module cage 400 is depicted in isolation (exploded view in FIG. 6B) where heat sink components are provided along two opposing panels 410 of the cage. In particular, each heat sink component comprises a base plate 605 that secures to a panel 410 of the cage 400, where a plurality of cooling fins 610 that extend transversely from the base plate 605. The base plate and cooling fins can comprise a metal and/or other material having suitable heat transfer properties (e.g., aluminum or copper) that facilitate transfer of heat generated by an optical module within the cage so as to adequately cool and prevent undesirable heating of the optical module during use. Each heat sink component further includes a clamp member or clip 620 that affixes the base plate 605 to a corresponding panel 410 of the cage 400. This configuration allows for the placement of heat sinks including cooling fins along at least two sides or panels of the optical module cage. In some embodiments, heat sink structure including cooling fins (e.g., of the type depicted in FIGS. 6A and 6B) can be provided along any number of sides or panels (e.g., along one panel, along two panels, along three or even all four panels) of the optical module cage to enhance heat transfer and cooling of the cage and optical module disposed within the cage.

The connecting structure 420 of the cages 400 provides an adequate connection and support of optical cages with the front panel (or any other panel) of the device housing in any arrangements and arrays, in which the front ends of the cages are connected to the panel while the opposing or rear end of each cage is floating or free (i.e., not connected to any support structure). In addition, further structural support for the cages can also be provided utilizing bridging spacers comprising support columns or support posts extending between cages in the same row and/or in neighboring rows in an array of cages. Referring to FIGS. 7A, 7B, 7C and 7D, interconnecting spacers or spacing structure 700 is provided that connects support columns or support posts between cages in an array. Support columns or support posts 710 are provided that extend between and connect with closely neighboring cages 400 from different rows. In addition, the spacing structure 700 includes support columns or support posts 720 that extend between and connect with consecutively aligned cages in the same row.

Figure 7A:
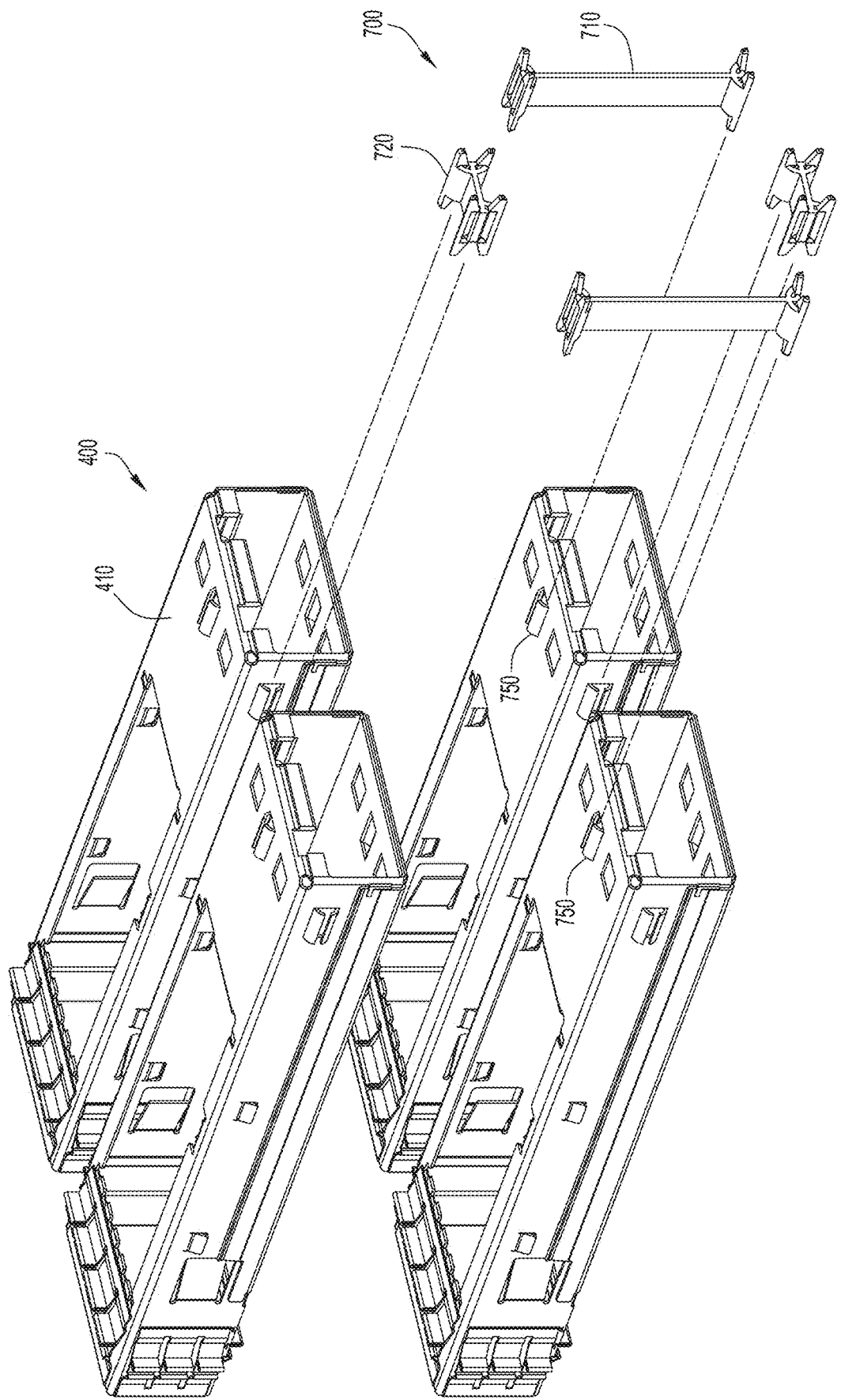
FIG. 7A depicts a view in perspective of a plurality of optical module cages including structural supports that connect between the cages prior to assembly in accordance with example embodiments described herein.
Figure 7C:
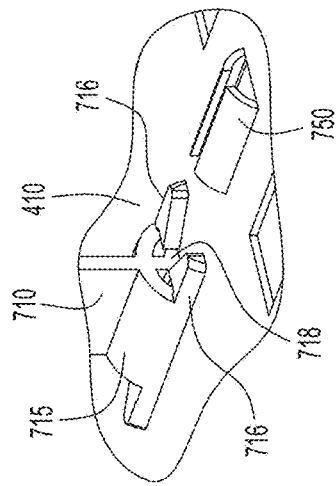
FIGS. 7C and 7D depict an enlarged view of a portion of an optical module cage and a structural support showing how the structural support connects with the cage in accordance with example embodiments described herein.
Figure 7D:
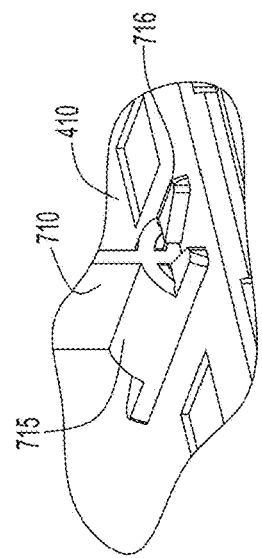
Figure 7B:
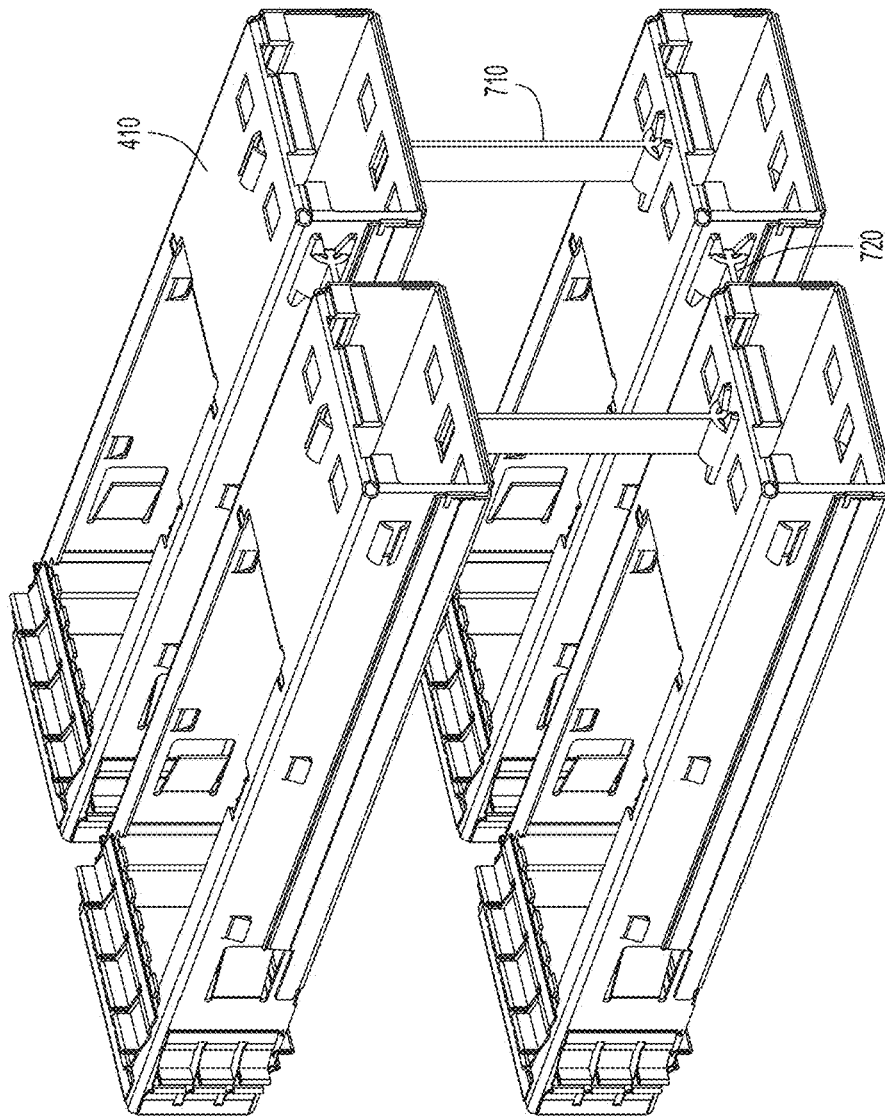
FIG. 7B depicts the view in perspective of FIG. 7A and in which the structural supports assembled or connected with the cages.

For example, in a 2×2 array of cages as shown in FIG. 7A (2 rows of cages, with 2 cages in each row), a support post 710 extends from a panel 410 of each cage 400 in the first row to a panel 410 of a cage 400 in the second row that is directly aligned with the cage in the first row. The support post 710 includes a foot 715 at each of its lengthwise ends. Each foot 715 includes a pair of base rails 716 extending outward from the foot end and a central rail 718 disposed between the base rails 716. Each cage 400 includes a track member 750 disposed along one or more panels 410 at a location near the rear end 414, where the track member 750 comprises a pair of flanges spaced a small distance from each other and extending transversely from the panel 410 at an angle toward the other flange so as to define a narrow track therebetween for receipt of the central rail 718 of the support post 710. As shown in FIGS. 7C and 7D, the support post 710 is guided along the facing panels 410 of the two aligned cages 400 in the first and second rows such that the central rail 718 slides within the track defined between the flanges of the track member 750, thus connecting the end of the support post 710 to the panel 410 of each of the two aligned cages 400 in rows 1 and 2. The support posts 720 and cages 400 include the same or similar structure that facilitates a bridging connection between the two cages consecutively aligned in the first row and between the two cages consecutively aligned in the second row.

Thus, the spacers or support posts can be easily aligned and slid or snap-fit into place for providing bridging interconnections between optical module cages located in the same row as well as in different rows. The spacers/support posts can be formed of metal, plastic and/or any other suitably rigid material that provides support and stability for the cages. While the embodiments in the drawings show only a single support post connecting each pair of neighboring cages together at or near the rear end (i.e., free or floating end) of each cage, it is noted that any number of support posts (e.g., one, two or more) can be provided along the same facing sides or panels of two or more aligned and closely neighboring cages to enhance support and stability of the cages in addition to the connection at their front ends with the front panel of the device housing. In addition, the spacers/support posts can have any other suitable geometries and/or any suitable mechanical connection structure that facilitates a bridging contact and connection between neighboring cages in the same row and also in separate, consecutively aligned rows. The spacers/support posts can further be shaped to minimize airflow impact around the cages.

The embodiments described herein facilitate a frictional or snap-in/snap-tight attachment or connection of optical module cages to a wall or panel (e.g., front panel) of the chassis or housing of an electronic device, where the cages can be suitably spaced from each other in any selected type of array that achieves a space saving for the housing, including space saving along the PCB within the housing (since the cages are not connected with and/or supported by the PCB). The configuration of the edge connector, also which can be frictionally or snap-in/snap-tight connected with the cages and can include cabling, also enable a space saving for components within the housing (e.g., since the cables can facilitate connections at a variety of different angles between optical modules housed within the cages and circuit components within the housing).

The ease with which cages, as well as optical modules within the cages, can be inserted/assembled and removed/disassembled, provides a modular design that facilitates ease of replacement or reconfiguration of device components within a housing. For example, in some embodiments, optical modules and their corresponding cages can be removed from the front plate and replaced by other components, such as a front replaceable fan tray that can improve air flow and cooling of the PCB, ASIC and/or one or more other circuit components within the device housing. This can facilitate non-heated air (e.g., air from the ambient environment directly surrounding the housing instead of air flowing around optical modules) to flow directly to the ASIC or other component within the housing.

In conventional optical module cage configurations, the optical modules and cages are oriented horizontally in relation to the housing. In this conventional configuration, it is typically very difficult to stack several modules without experiencing a negative impact on operational temperatures for the modules and/or for other components within the device housing. In contrast, and as described herein (e.g., with reference to FIG. 2B), an array of cages and optical modules can be arranged vertically in relation to the housing, which facilitates an increase in port density (e.g., as up to about 20% for a 1 RU form factor, where number of ports can be increased from 32 to 38) with minimal thermal impact and while maintaining operational temperatures for the device within tolerance levels.

The vertical orientation of cages and modules also facilitates greater flexibility in the face plate/front panel design, allowing for slanted or angled panel designs without the requirement of modified heatsink fin designs for the cages. The connection configurations for the cages with the front panel further allow for enhanced airflow rates around the cages and a resultant reduction in optical module temperatures even at lower air flow approach velocities around the cages during device operations.

Figure 8:
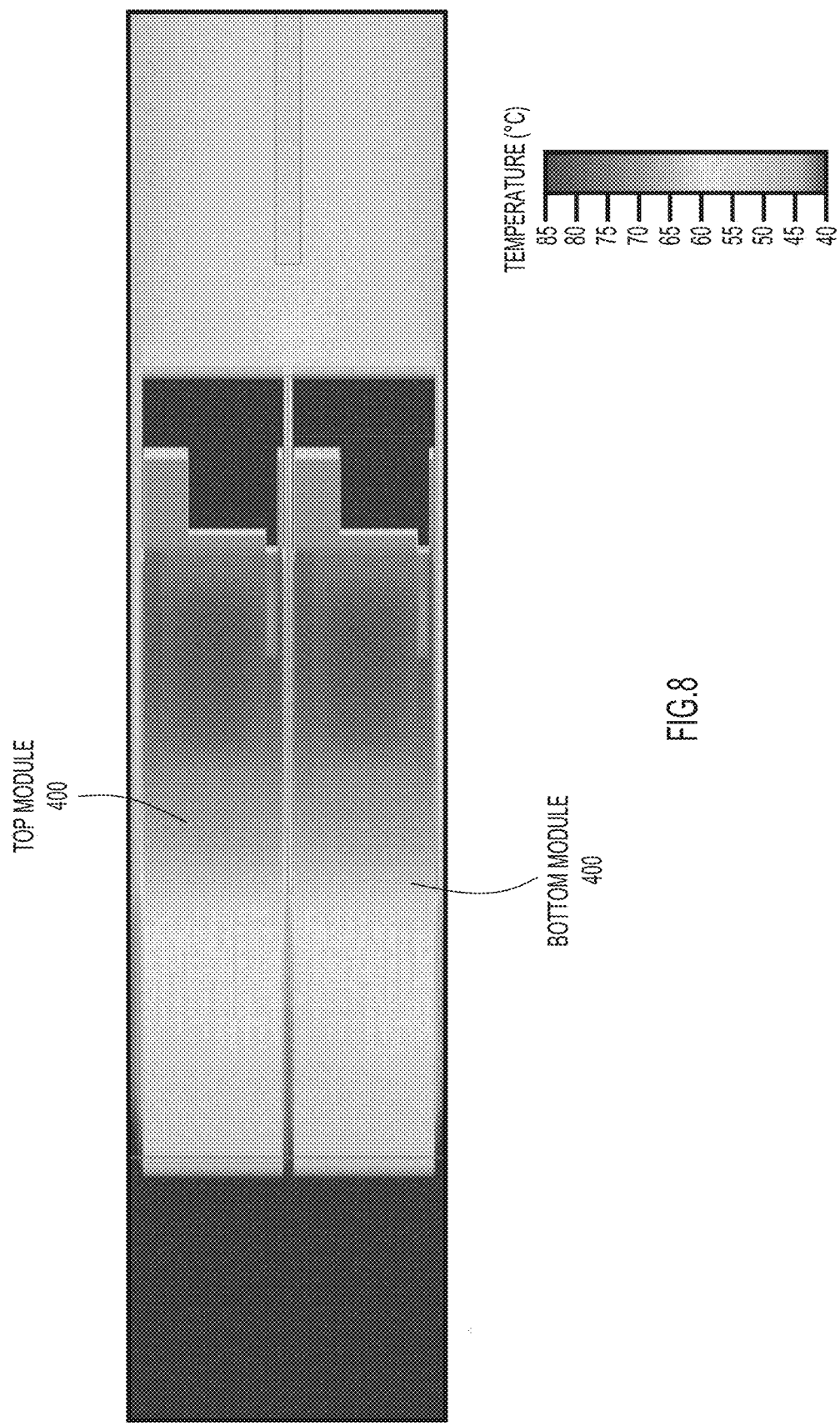
FIG. 8 depicts an example embodiment showing the operational temperature distribution of a vertically stacked arrangement of two optical modules disposed within corresponding cages.

As shown in FIG. 8, an example embodiment shows the operational temperature distribution of a vertically stacked arrangement of two optical modules disposed within two cages 400. The data provided in FIG. 8 shows that the temperature distribution is about the same for both modules in the vertically stacked cages 400 (i.e., almost no skewness between the two vertically stacked modules). In contrast, in a conventional horizontal design, temperatures may different by more than 10° C. between two consecutive horizontally aligned modules.

Thus, the embodiments described herein provide an optical module cage mounting configuration that are modular in design and can be independent of a printed circuit board mounting system. The cages and their connections with a panel of the electronic device housing enable improved density, cooling, mounting, and/or signal integrity for a variety of applications.

Optical module cages described herein may be located within a line card, fabric card, or other modular card or fixed design. The embodiments operate in the context of a data communications network including multiple network devices. The network may include any number of network devices in communication via any number of nodes (e.g., routers, switches, gateways, controllers, access points, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT), Internet, intranet, or any other network). The network may include any number or arrangement of network communications devices (e.g., switches, access points, routers, or other devices operable to route (switch, forward) data communications).

The optical modules are coupled to electronic components, which may be operable to interface telecommunication lines (e.g., copper wire, optical fibers) in a telecommunications network. The network device may be configured to perform one or more operations and receive any number or type of pluggable transceiver modules configured for transmitting and receiving signals, and may be configured for operation in any type of chassis or network device (e.g., router, switch, gateway, controller, edge device, access device, aggregation device, core node, intermediate node, or other network device).

The network device may be a programmable machine that may be implemented in hardware, software, or any combination thereof. The network device includes one or more processor, memory, and network interfaces. Memory may be a volatile memory or non-volatile storage, which stores various applications, operating systems, modules, and data for execution and use by the processor. Logic may be encoded in one or more tangible media for execution by the processor. For example, the processor may execute codes stored in a computer-readable medium such as memory. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. The network device may include any number of processors. In one example, the computer-readable medium comprises a non-transitory computer-readable medium. The network interfaces may comprise any number of interfaces (line cards, ports) for receiving data or transmitting data to other devices. The network interfaces may be configured to transmit or receive data using a variety of different communication protocols. The interfaces may include mechanical, electrical, and signaling circuitry for communicating data over physical links coupled to the network. The network device may further include any suitable combination of hardware, software, processors, devices, components, or elements operable to facilitate the capabilities described herein.

Thus, an example embodiment of an apparatus comprises a housing including a panel, where the panel includes a window, and a cage including a plurality of panels and a first end and a second end that opposes the first end, the cage including an opening at its first end and an enclosure disposed between the panels of the cage. The apparatus further comprises connecting structure disposed at the first end of the cage, where the connecting structure secures the first end of the cage to the panel. The cage is suitably dimensioned to receive and retain a portion of an optical module within the enclosure when the optical module is inserted within the opening at the first end of the cage.

The cage can extend from the first end to the second end in a cantilevered manner from the panel.

The apparatus can further comprise an edge connector disposed at the second end of the cage, where the edge connector includes engaging structure that enables an exchange of signals between the optical module and a circuit component within the housing. The edge connector can be releasably connected with the second end of the cage via a frictional locking connection.

The edge connector can directly connect with the circuit component disposed on a printed circuit board (PCB). The apparatus can also comprise a plurality of cables connected with edge connector, where the cables are dimensioned to extend to and connect with the circuit component within the housing to enable the exchange of signals between the optical module and the circuit component.

The housing can include a top panel, a bottom panel opposing the top panel, and a front panel extending between the top panel and the bottom panel, the front panel including a plurality of windows arranged in an array along the front panel. The apparatus can also further comprise a plurality of cages, each cage including a first end and a second end and an opening at the first end, where connecting structure disposed at the first end of each cage secures the first end of each cage to the panel at a corresponding one of the plurality of windows. A lengthwise dimension of the opening at the first end of each cage can be oriented vertically such that the lengthwise dimension is transverse an orientation of each of the top panel and the bottom panel.

The apparatus can further comprise at least one support post that extends and provides a bridging connection between at least two cages secured to the front panel. The at least one support post can comprise a plurality of support posts, the plurality of support posts including a first support post that connects a first cage secured to the front panel with a second cage secured to the front panel, where the first and second cages are located at windows arranged in a first row of windows along the panel, and a second support post that connects the first cage with a third cage secured to the front panel, where the third cage is located at a window arranged along a second row of windows that is displaced from the first row of windows.

The apparatus can further comprise a plurality of heat sink components coupled with the cage, each heat sink component comprising a plurality of cooling fins extending transversely from at least two panels of the cage.

An electronic device can comprise the apparatus as described herein, where the panel comprises a front panel for the housing.

In other example embodiments, a cage comprises a plurality of panels that define an enclosure between the panels, a first end including an opening, a second end that opposes the first end, and connecting structure disposed at the first end of the cage, where the connecting structure secures the first end of the cage to a panel of a housing. The cage can be suitably dimensioned to receive and retain a portion of an optical module within the enclosure when the optical module is inserted within the opening at the first end of the cage.

The cage can further comprise an edge connector disposed at the second end of the cage, where the edge connector includes engaging structure that enables an exchange of signals between the optical module and a circuit component within the housing.

The cage can also further comprise a plurality of cables connected with edge connector, where the cables are dimensioned to extend to and connect with the circuit component within the housing to enable the exchange of signals between the optical module and the circuit component.

In further example embodiments, a method comprises providing a cage including a plurality of panels that define an enclosure between the panels, a first end including an opening, and a second end that opposes the first end, facilitating a connection, via connecting structure disposed at the first end of the cage, between the first end of the cage and a panel of a housing for an electronic device such that the cage extends from the first end to the second end in a cantilevered manner from the panel, and facilitating insertion of an optical module into the opening at the first and end into the enclosure of the cage such that the optical module engages with an edge connector disposed at the second end of the cage, where the edge connector includes engaging structure that enables an exchange of signals between the optical module and a circuit component within the housing.

The method can further comprise facilitating a direct connection between the edge connector and the circuit component within the housing. The method can also further comprise providing cables that connect with the edge connector and are dimensioned to extend to and connect with the circuit component within the housing to enable the exchange of signals between the optical module and the circuit component.

In the method, the housing can include a top panel, a bottom panel opposing the top panel, and a front panel extending between the top panel and the bottom panel, the front panel including a plurality of windows arranged in an array along the front panel. The method can further comprise facilitating connection of a plurality of cages, each cage including a first end and a second end and an opening at the first end, with the front panel, where each cage connects at the first end of each cage to the panel at a corresponding one of the plurality of windows. A lengthwise dimension of the opening at the first end of each cage can be oriented vertically such that each cage connects with the front panel and the lengthwise dimension of each cage is transverse an orientation of each of the top panel and the bottom panel.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a housing including a panel, wherein the panel includes a plurality of windows;
a plurality of spaced apart cages, each cage partially extending within a corresponding window of the panel and including a plurality of panels and a first end and a second end that opposes the first end, each cage further including an opening at the first end and an enclosure disposed between the panels of each cage, and each panel for the plurality of panels of each cage is spaced from the panels of every other cage;
a first support post that extends and provides a bridging connection between facing panels of a first cage and a second cage secured to the panel of the housing, the first support post providing the bridging connection at the facing panels of the first cage and the second cage while remaining outside of each of the first cage and the second cage; and
connecting structure disposed at the first end of each cage, wherein the connecting structure secures the first end of each cage at the corresponding window and to the panel of the housing;
wherein each cage is suitably dimensioned to receive and retain a portion of a pluggable module within the enclosure when the pluggable module is inserted within the opening at the first end of each cage.

2. The apparatus of claim 1, further comprising:
a second support post that extends and provides a bridging connection between facing panels of the first cage and a third cage secured to the panel of the housing, wherein the second support post extends in a second direction that is transverse a first direction in which the first support post extends, and the second support post provides the bridging connection at the facing panels of the first cage and the third cage while remaining outside of each of the first cage and the third cage.

3. The apparatus of claim 2, wherein the first cage and the second cage are located at windows arranged in a first row of windows along the panel, and the third cage is located at a window arranged along a second row of windows that is displaced from the first row of windows.

4. The apparatus of claim 1, wherein at least one cage is suitably dimensioned to receive and retain a portion of an optical module within the enclosure when the optical module is inserted within the opening at the first end of each cage.

5. The apparatus of claim 1, wherein each cage extends from the first end to the second end in a cantilevered manner from the panel.

6. The apparatus of claim 1, further comprising:
an edge connector disposed at the second end of each cage, wherein the edge connector includes engaging structure that enables an exchange of signals between the pluggable module and a circuit component within the housing.

7. The apparatus of claim 6, wherein the edge connector is releasably connected with the second end of each cage via a frictional locking connection.

8. The apparatus of claim 6, wherein the edge connector of each cage further directly connects with the circuit component disposed on a printed circuit board (PCB).

9. The apparatus of claim 6, further comprising a plurality of cables connected with the edge connector of each cage, wherein the cables are dimensioned to extend to and connect with the circuit component within the housing to enable the exchange of signals between the pluggable module and the circuit component.

10. The apparatus of claim 1, wherein the housing includes a top panel, a bottom panel opposing the top panel, and a front panel extending between the top panel and the bottom panel, the front panel including the plurality of windows arranged in an array along the front panel, each cage being secured at a corresponding window of the front panel.

11. The apparatus of claim 10, wherein a lengthwise dimension of the opening at the first end of each cage is oriented vertically such that the lengthwise dimension is transverse an orientation of each of the top panel and the bottom panel.

12. The apparatus of claim 1, further comprising a plurality of heat sink components coupled with at least one cage of the plurality of cages, each heat sink component comprising a plurality of cooling fins extending transversely from at least two panels of the at least one cage.

13. An electronic device comprising the apparatus of claim 1, wherein the panel comprises a front panel for the housing.

14. A cage comprising:
a plurality of panels that define an enclosure between the panels;
a first end including an opening;
a second end that opposes the first end;
connecting structure disposed at the first end of the cage, wherein the connecting structure secures the first end of the cage to a panel of a housing; and
a first support post that extends and provides a bridging connection from a first panel of the cage to a second panel of a second cage that is spaced apart from the first panel of the cage when the cage and the second cage are connected in a cantilevered manner from the panel of the housing, the first support post providing the bridging connection at the first panel of the cage and the second panel of the second cage while remaining outside of each of the cage and the second cage;
wherein the cage is suitably dimensioned to receive and retain a portion of a pluggable module within the enclosure when the pluggable module is inserted within the opening at the first end of the cage.

15. The cage of claim 14, further comprising:
a second support post that extends and provides a bridging connection from a third panel of the cage to a fourth panel of a third cage that is spaced apart from the second panel of the cage when the cage and the third cage are connected in a cantilevered manner from the panel of the housing;

wherein the second support post extends in a second direction that is transverse a first direction in which the first support post extends, and the second support post provides the bridging connection at the third panel of the cage and the fourth panel of the third cage while remaining outside of each of the cage and the third cage.

16. The cage of claim 14, further comprising:

an edge connector disposed at the second end of the cage, wherein the edge connector includes engaging structure that enables an exchange of signals between the pluggable module and a circuit component within the housing.

17. The cage of claim 16, further comprising:

a plurality of cables connected with the edge connector, wherein the cables are dimensioned to extend to and connect with the circuit component within the housing to enable the exchange of signals between the pluggable module and the circuit component.

18. A method comprising:

providing a plurality of spaced apart cages, each cage including a plurality of panels that define an enclosure between the panels, a first end including an opening, and a second end that opposes the first end, wherein each panel for the plurality of panels of each cage is spaced from the panels of every other cage;

facilitating a connection, via connecting structure disposed at the first end of each cage, between the first end of each cage and a panel of a housing for an electronic device such that each cage extends from the first end to the second end in a cantilevered manner from the panel of the housing;

facilitating a connection between a first cage and a second cage secured to the panel of the housing via a first support post that extends and provides a bridging connection between facing panels of the first cage and the second cage, the first support post providing the bridging connection at the facing panels of the first cage and the second cage while remaining outside of each of the first cage and the second cage; and facilitating insertion of a pluggable module into the opening at the first end into the enclosure of each cage such that the pluggable module engages with an edge connector disposed at the second end of each cage, wherein the edge connector includes engaging structure that enables an exchange of signals between the pluggable module and a corresponding circuit component within the housing.

19. The method of claim 18, further comprising:

facilitating a connection between the first cage and a third cage secured to the panel of the housing via a second support post that extends and provides a bridging connection between facing panels of the first cage and the third cage, wherein the second support post extends in a second direction that is transverse a first direction in which the first support post extends, and the second support post provides the bridging connection at the facing panels of the first cage and the third cage while remaining outside of each of the first cage and the third cage.

20. The method of claim 18, wherein the housing includes a top panel, a bottom panel opposing the top panel, and a front panel extending between the top panel and the bottom panel, the front panel including a plurality of windows arranged in an array along the front panel, and the method further comprises:

facilitating connection of a plurality of cages, each cage including a first end and a second end and an opening at the first end, with the front panel, wherein each cage connects at the first end of each cage to the panel at a corresponding one of the plurality of windows.

\* \* \* \* \*